(12) United States Patent
Toshiyuki et al.

(10) Patent No.: US 10,033,262 B2
(45) Date of Patent: Jul. 24, 2018

(54) GATE VOLTAGE CONTROL DEVICE

(71) Applicant: TOYOTA JIDOSHA KABUSHIKI KAISHA, Toyota-shi, Aichi-ken (JP)

(72) Inventors: Ken Toshiyuki, Seto (JP); Shoji Abo, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 24 days.

(21) Appl. No.: 15/419,439

(22) Filed: Jan. 30, 2017

(65) Prior Publication Data

US 2017/0257020 A1 Sep. 7, 2017

(30) Foreign Application Priority Data

Mar. 4, 2016 (JP) ................. 2016-042656

(51) Int. Cl.
| | |
|---|---|
| *H03K 3/00* | (2006.01) |
| *H02M 1/088* | (2006.01) |
| *H02M 3/335* | (2006.01) |
| *H02M 7/5387* | (2007.01) |
| *H03K 17/08* | (2006.01) |
| *H02P 27/08* | (2006.01) |

(Continued)

(52) U.S. Cl.
CPC ....... *H02M 1/088* (2013.01); *H02M 3/33507* (2013.01); *H02M 7/5387* (2013.01); *H02P 27/08* (2013.01); *H03K 17/08* (2013.01); *H03K 17/0828* (2013.01); *H02M 2001/0054* (2013.01); *H02P 27/06* (2013.01); *Y02B 70/1491* (2013.01)

(58) Field of Classification Search
None
See application file for complete search history.

(56) References Cited

U.S. PATENT DOCUMENTS

| | | | |
|---|---|---|---|
| 2012/0212160 A1 | 8/2012 | Shindo et al. | |
| 2015/0137871 A1* | 5/2015 | Takano | ................ H03K 17/687 327/389 |

(Continued)

FOREIGN PATENT DOCUMENTS

| | | |
|---|---|---|
| JP | 2011-244521 A | 12/2011 |
| JP | 2017-099100 A | 6/2017 |

*Primary Examiner* — Lincoln Donovan
*Assistant Examiner* — Khareem E Almo
(74) *Attorney, Agent, or Firm* — Oliff PLC

(57) ABSTRACT

A gate voltage control device includes a detection circuit, a plurality of isolation transformers including primary coils and secondary coils, a primary circuit connected to the primary coils, secondary circuits connected to the secondary coils, and voltage regulator circuits connected to the secondary circuits and gates. The detection circuit transmits signal corresponding to detected physical quantity to the primary circuit. The primary circuit cyclically performs applying a variable voltage in a waveform that corresponds to the signal transmitted from the detection circuit between both ends of each primary coil. Each secondary circuit converts the variable voltage generated in the corresponding secondary coil to a direct voltage. Each voltage regulator circuit is powered by the direct voltage converted by the corresponding secondary circuit as a power source, and changes a change-pattern of the corresponding gate voltage according to a waveform of the variable voltage generated in the corresponding secondary coil.

12 Claims, 16 Drawing Sheets

(51) Int. Cl.
    *H03K 17/082*    (2006.01)
    *H02M 1/00*    (2006.01)
    *H02P 27/06*    (2006.01)

(56) References Cited

U.S. PATENT DOCUMENTS

| | | | | |
|---|---|---|---|---|
| 2015/0330195 | A1* | 11/2015 | Dong | E21B 43/128 307/31 |
| 2015/0349649 | A1* | 12/2015 | Zane | H02M 3/33507 363/21.03 |
| 2015/0365003 | A1* | 12/2015 | Sadwick | H02M 3/28 363/21.01 |
| 2016/0111962 | A1* | 4/2016 | Mao | H02M 3/33507 363/21.16 |
| 2016/0118905 | A1* | 4/2016 | Freeman | H02M 3/33546 363/21.1 |
| 2017/0257020 | A1* | 9/2017 | Toshiyuki | H02M 1/088 |
| 2018/0091137 | A1* | 3/2018 | Schneider | H03K 17/56 |

* cited by examiner

GATE VOLTAGE CONTROL DEVICE

CROSS-REFERENCE TO RELATED APPLICATION

This application claims priority to Japanese Patent Application No. 2016-042656 filed an Mar. 4, 2016, the contents of which are hereby incorporated by reference into the present application.

TECHNICAL FIELD

The teachings disclosed herein relates to a gate voltage control device.

BACKGROUND ART

Japanese Patent Application Publication No. 2011-244521 discloses an inverter device in which a photocoupler is inserted in a signal transmission passage.

SUMMARY

A circuit that detects a physical quantity (for example, current or voltage of a main current circuit, a switching element temperature, instruction signals from outside, and the like) when the main current circuit is to be turned an or off by a switching element, and changes a change-pattern of a gate voltage of the switching element according to the detected value is being developed. In this type of gate voltage control device, a detection circuit that detects the physical quantity and a voltage regulator circuit that controls the gate voltage of the switching element are provided. A signal corresponding to the physical quantity is transmitted from the detection circuit to the voltage regulator circuit, and the voltage regulator circuit controls the gate voltage according to the transmitted signal. A reference voltage may become large in the detection circuit and the voltage regulator circuit, and in this case, it is difficult to directly connect them together. Due to this, an isolation element such as a photocoupler (an element capable of transmitting signals in a state where a reference potential on an input side and a reference potential on an output side differ) is inserted in the signal transmission passage, and the signal is sent from the detection circuit to the voltage regulator circuit via the isolation element. However, the isolation element has a large size due to its need to secure sufficient isolation performance. When there exists a plurality of voltage regulator circuits for controlling a plurality of switching elements, an isolation element needs to be provided for each voltage regulator circuit. Due to this, the gate voltage control device becomes large in size.

A gate voltage control device disclosed herein is configured to control a gate voltage applied to each of gates of a plurality of switching elements connected to a main current circuit. The gate voltage control device comprises: a detection circuit; a plurality of isolation transformers, each isolation transformer including a primary coil and a secondary coil; a primary circuit connected to the primary coils; a plurality of secondary circuits, each secondary circuit being connected to a corresponding one of the secondary coils; and a plurality of voltage regulator circuits, each voltage regulator circuit being connected to a corresponding one of the secondary circuits and a corresponding one of the gates. The detection circuit detects a physical quantity, and transmits a signal corresponding to the detected physical quantity to the primary circuit. The primary circuit is configured to allow a variable voltage to be applied in a plurality of waveform types between both ends of each primary coil, and the primary circuit cyclically performs applying the variable voltage in a waveform type that corresponds to the signal transmitted from the detection circuit to between both ends of each primary coil. Each secondary circuit converts the variable voltage generated in the corresponding secondary coil to a direct voltage. Each voltage regulator circuit is powered by the direct voltage converted by the corresponding secondary circuit as a power source, changes the corresponding gate voltage cyclically, and changes a change-pattern of the corresponding gate voltage in accordance with a waveform type of the variable voltage generated in the corresponding secondary coil.

Notably, changing the change-pattern of the gate voltage may mean changing a speed for transitioning the gate voltage between an on-voltage and an off-voltage (voltage change rate), may mean changing a magnitude of the on-voltage or the off-voltage, may mean changing a ratio between an on-voltage application period and an off-voltage application period (that is, duty ratio thereof), or may mean changing other properties.

In this gate voltage control device, the detection circuit detects the physical quantity and transmits the signal corresponding to the detected physical quantity to the primary circuit. If the reference voltage differs between the detection circuit and the primary circuit, an isolation element may be provided on a communication passage between the detection circuit and the primary circuit. The primary circuit applies the variable voltage that changes cyclically between both ends of each primary coil. In so doing, a variable voltage with a waveform corresponding to the variable voltage applied to the primary coil is generated in the corresponding secondary coil. Each of the secondary circuits converts the variable voltage generated in the secondary coil into the direct voltage. Each voltage regulator circuit is powered by the direct voltage converted by its corresponding secondary circuit as the power source. That is, a power supply circuit for supplying the direct voltage to the plurality of voltage regulator circuits is configured by the primary circuit, the plurality of isolation transformers, and the plurality of secondary circuits. Notably, the primary and secondary coils of each isolation transformer are isolated. Due to this, the primary circuit and the secondary circuit being a corresponding pair operate in different reference voltages. Further, in this gate voltage control device, the primary circuit receives the signal corresponding to the physical quantity detected by the detection circuit, and applies the variable voltage having the waveform type corresponding to this signal on the respective primary coils. Due to this, the variable voltages having the waveforms corresponding to the physical quantity are generated in the secondary coils as well. Each voltage regulator circuit changes the change-pattern of the gate voltage according to the waveform type of the variable voltage generated in its corresponding secondary coil. Thus, the voltage regulator circuit can change the change-pattern of the gate voltage according to the physical quantity. As described above, in this gate voltage control device, the signal indicating the physical quantity can be transmitted from the primary circuit to the respective voltage regulator circuits via the isolation transformers even if an isolation element is provided between the detection circuit and the primary circuit. The signal indicating the physical quantity can be transmitted to the respective voltage regulator circuits via the isolation transformers functioning as a part of the power supply circuit for supplying the direct voltage. Due to this, the isolation transformer dedicated to the signal transmission may not need to be provided for each voltage regulator circuit. Due to this, the insulation elements dedicated to the signal transmission can be omitted. Thus, according to this configuration, the size of the gate voltage control device can be reduced.

DETAILED DESCRIPTION

First Embodiment

Figure 1:
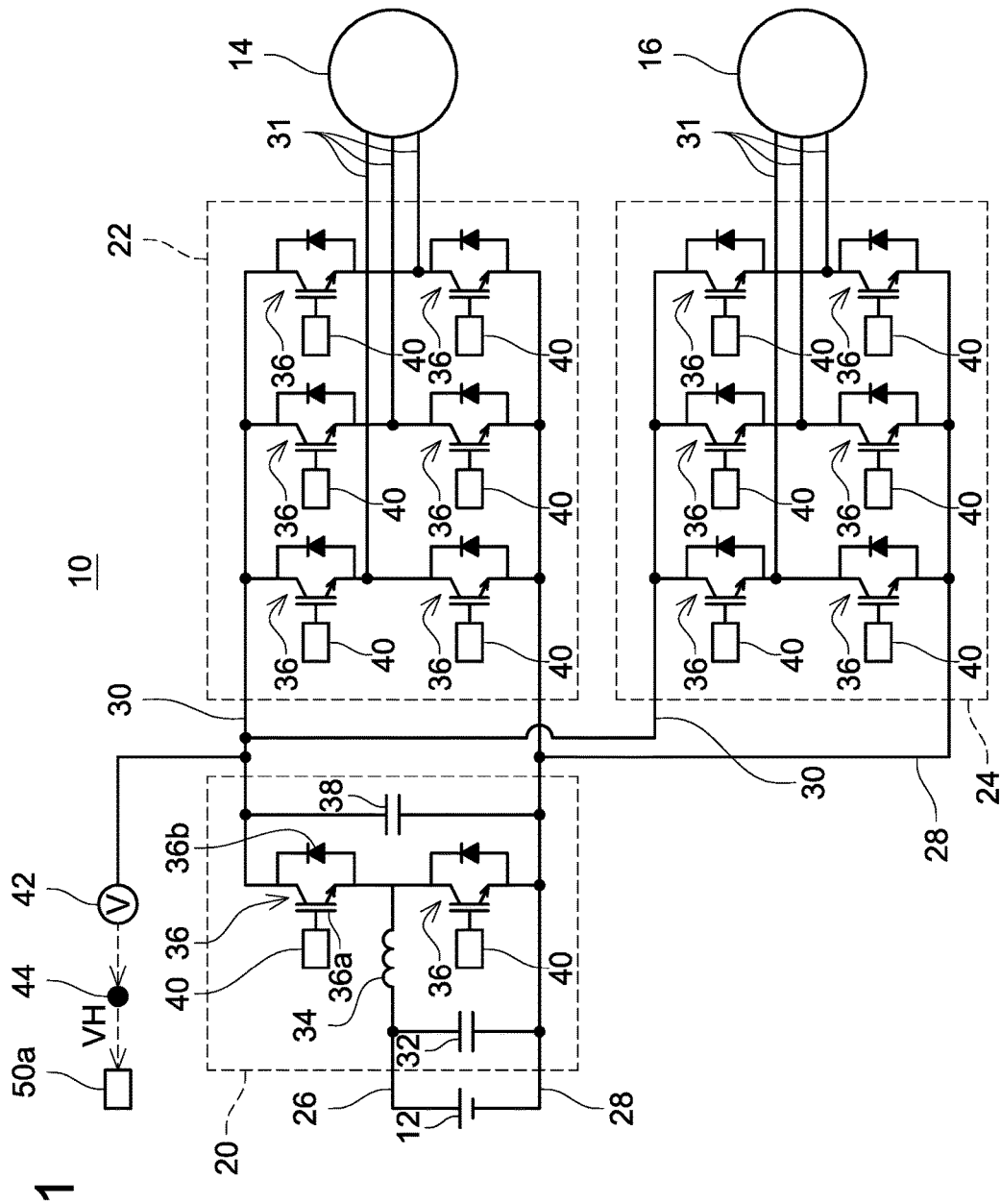
FIG. 1 is a circuit diagram of a motor driving circuit 10.

A motor driving circuit 10 shown in FIG. 1 converts a DC voltage from a battery 12 into a three-phase AC voltage and supplies the same to motors 14, 16. The motor driving circuit 10 includes a converter circuit 20, a first inverter circuit 22, and a second inverter circuit 24. The battery 12 and the converter circuit 20 are connected by a first high-potential wiring 26 and a low-potential wiring 28. The converter circuit 20 and the first inverter circuit 22 are connected by a second high-potential wiring 30 and the low-potential wiring 28. The converter circuit 20 and the second inverter circuit 24 are connected by the second high-potential wiring 30 and the low-potential wiring 28.

The converter circuit 20 includes a smoothing capacitor 32, a reactor 34, two RC-IGBTs (Reverse Conducting Insulated Gate Bipolar Transistors) 36, and a smoothing capacitor 38. The reactor 34 is provided on the first high-potential wiring 26. The smoothing capacitor 32 is connected between the first high-potential wiring 26 and the low-potential wiring 28 at a portion on a battery 12 side of the reactor 34. Each of the RC-IGBTs 36 is constituted of an IGBT 36a and a diode 36b. A collector of the IGBT 36a is connected to a cathode of the diode 36b, and an emitter of the IGBT 36a is connected to an anode of the diode 36b. The two RC-IGBTs 36 are connected serially between the second high-potential wiring 30 and the low-potential wiring 28 in a direction along which the collectors are oriented toward the second high-potential wiring 30 side. The first high-potential wiring 26 at a downstream portion of the reactor 34 is connected to a wiring between the two RC-IGBTs 36. The smoothing capacitor 38 is connected between the second high-potential wiring 30 and the low-potential wiring 28. The converter circuit 20 boosts a DC voltage of the battery 12 by switching the respective RC-IGBTs 36 (that is, each IGBT 36a), and outputs the same between the second high-potential wiring 30 and the low-potential wiring 28.

The first inverter circuit 22 includes three serial circuits of the RC-IGBTs 36. Each serial circuit includes two RC-IGBTs 36 serially connected between the second high-potential wiring 30 and the low-potential wiring 28. The RC-IGBTs 36 are connected with their collectors oriented toward the second high-potential wiring 30. Notably, the configuration of the respective RC-IGBTs 36 in the first inverter circuit 22 is equal to the configuration of the RC-IGBTs 36 in the converter circuit 20. In each of these serial circuits, an output wiring 31 is connected to the wiring between the two RC-IGBTs 36. Each of the output wirings 31 is connected to the motor 14. The first inverter circuit 22 converts the DC voltage between the second high-potential wiring 30 and the low-potential wiring 28 (output voltage of the converter circuit 20) into a three-phase AC voltage by switching the respective RC-IGBTs 36 (that is, each of the IGBTs 36a). The three-phase AC voltage is supplied to the motor 14 through the output wirings 31.

The second high-potential wiring 30 and the low-potential wiring 28 branch off at parts thereof, and the second inverter circuit 24 is provided at their branched portions. The configuration of the second inverter circuit 24 is equal to the configuration of the first inverter circuit 22. The second inverter circuit 24 supplies the three-phase AC voltage to the motor 16 by switching the respective RC-IGBTs 36 (that is, each of the IGBTs 36a).

The motor driving circuit 10 includes a detection circuit 42 configured to detect a potential VH of the second high-potential wiring 30. The detection circuit 42 transmits a signal corresponding to a value of the detected potential VH to a primary circuit 50a of a gate voltage control circuit 50 to be described later through an isolation element 44 (for example, a photocoupler). The primary circuit 50a is a circuit that operates at a much lower voltage than the detection circuit 42. Due to this, the isolation element 44 is provided on a signal voltage passage between the detection circuit 42 and the primary circuit 50a.

A voltage regulator circuit 40 is provided at a gate of the IGBT 36a of each RC-IGBT 36. One voltage regulator circuit 40 is provided for each IGBT 36a. As shown in FIG. 1, since the motor driving circuit 10 includes fourteen IGBTs 36a, the motor driving circuit 10 includes fourteen voltage regulator circuits 40. Each of the voltage regulator circuits 40 controls a potential of its corresponding IGBT 36a to switch the IGBT 36a. Each voltage regulator circuit 40 operates by having a DC voltage supply. Further, although it will be described in detail later, a signal indicating a value of the potential VH of the second high-potential wiring 30 is transmitted to each of the voltage regulator circuits 40. Each of the voltage regulator circuits 40 changes a switching speed of its corresponding IGBT 36a according to the potential VH of the second high-potential wiring 30.

Figure 2:
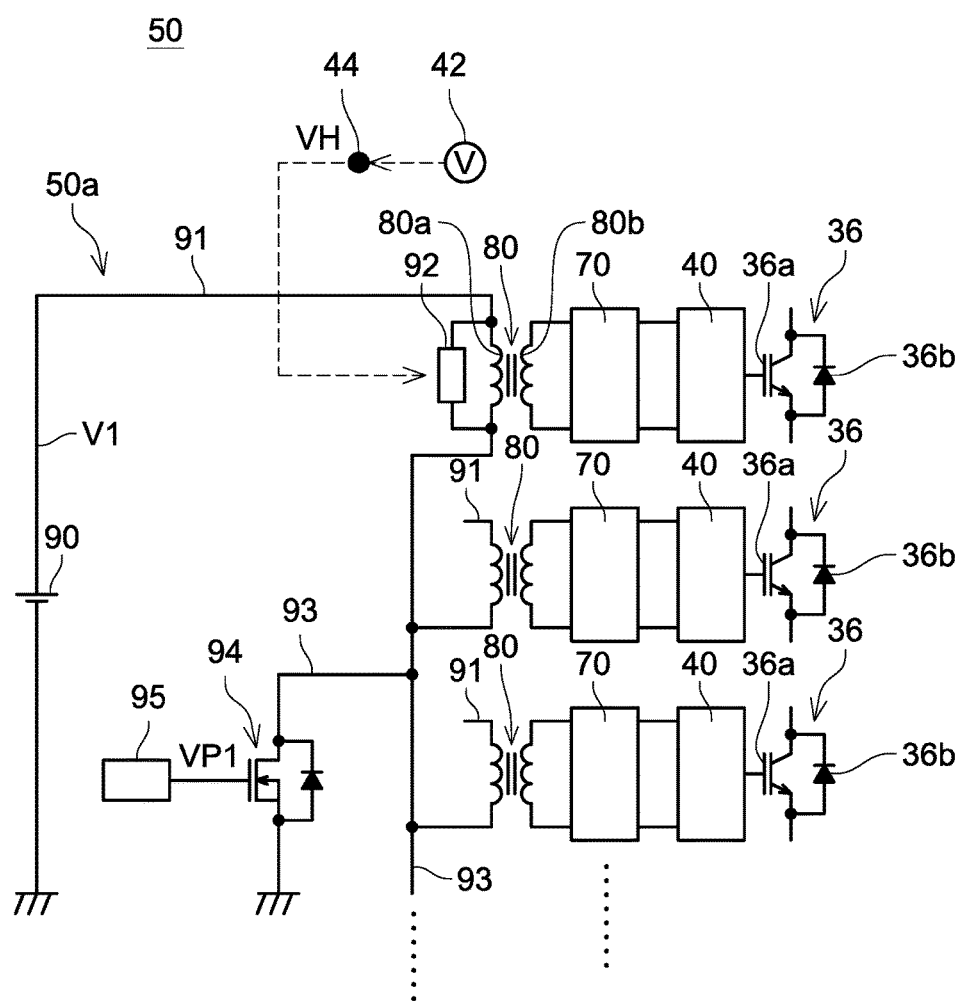
FIG. 2 is a circuit diagram of a gate voltage control circuit 50 of a first embodiment.

The gate voltage control circuit 50 shown in FIG. 2 is a circuit that controls the respective IGBTs 36a. The gate voltage control circuit 50 includes a plurality of isolation transformers 80, a primary circuit 50a, and a plurality of secondary circuits 70. Each of the isolation transformers 80 includes a primary coil 80a and a secondary coil 80b. Each of the primary coils 80a is electrically isolated from its corresponding secondary coil 80b. The primary circuit 50a is connected to the respective primary coils 80a of the isolation transformers 80. Each of the secondary circuits 70 is connected to the secondary coil 80b of its corresponding isolation transformer 80. Notably, although depiction is partially omitted in FIG. 2, the gate voltage control circuit 50 includes fourteen isolation transformers 80. One primary circuit 50a is connected to respectively the fourteen primary coils 80a. Each of the secondary circuits 70 is provided separately for the corresponding one of the isolation transformers 80. That is, the gate voltage control circuit 50 includes fourteen secondary circuits 70 corresponding to fourteen isolation transformers 80. Each of the fourteen secondary circuits 70 is connected to its corresponding secondary coil 80b. Further each of the fourteen secondary circuits 70 is connected to its corresponding voltage regulator circuit 40. The primary circuit 50a supplies power to the secondary circuits 70 through their respective isolation transformers 80. Each of the secondary circuits 70 converts a variable voltage generated between both ends of its corresponding secondary coil 80b into DC voltage and supplies the same to its corresponding voltage regulator circuit 40. The voltage regulator circuits 40 operate on the DC voltage supplied from the secondary circuits 70. Further, as aforementioned, the primary circuit 50a receives the signal indicating the value of the potential VH from the detection circuit 42. The primary circuit 50a transmits the signal indicating the value of the potential VH to the respective voltage regulator circuits 40 through the isolation transformers 80. The voltage regulator circuits 40 change the switching speeds of the IGBTs 36a according to the value of the potential VH.

As shown in FIG. 2, the primary circuit 50a includes a DC power source 90, a signal voltage application circuit 92, an NMOS 94, and a power supply control device 95.

The DC power source 90 applies a DC voltage V1. A positive electrode of the DC power source 90 is connected to one ends of the respective primary coils 80a via a wiring 91. Notably, although it is omitted in FIG. 2, the wiring 91 separates into plural branches from a portion connected to the positive electrode of the DC power source 90, and each of the branched portions is connected to the one end of the corresponding primary coil 80a. A negative electrode of the DC power source 90 is connected to the ground.

The other ends of the primary coils 80a are connected to a drain of the NMOS 94 via a wiring 93. A source of the NMOS 94 is connected to a ground. That is, the source of the NMOS 94 is connected to the negative electrode of the DC power source 90 via the ground.

The power supply control device 95 is connected to the gate of the NMOS 94. The power supply control device 95 applies a pulse signal VP1 having a certain cycle to the gate of the NMOS 94. The NMOS 94 is on during when the pulse signal VP1 is of a high potential, and the NMOS 94 is off during when the pulse signal VP1 is of a low potential. Thus, the NMOS 94 repeats to turn on and off according to the certain cycle.

The signal voltage application circuit 92 is connected between the wiring 91 and the wiring 93. That is, the signal voltage application circuit 92 is connected in parallel to the respective primary coils 80a. The signal indicating the value of the potential VH (potential detected by the detection unit 42) is transmitted from the isolation element 44 to the signal voltage application circuit 92. The signal voltage application circuit 92 controls the voltage between the wiring 91 and the wiring 93 (that is, the voltage applied to each of the primary coils 80a) according to the received value of the potential VH.

Figure 3:
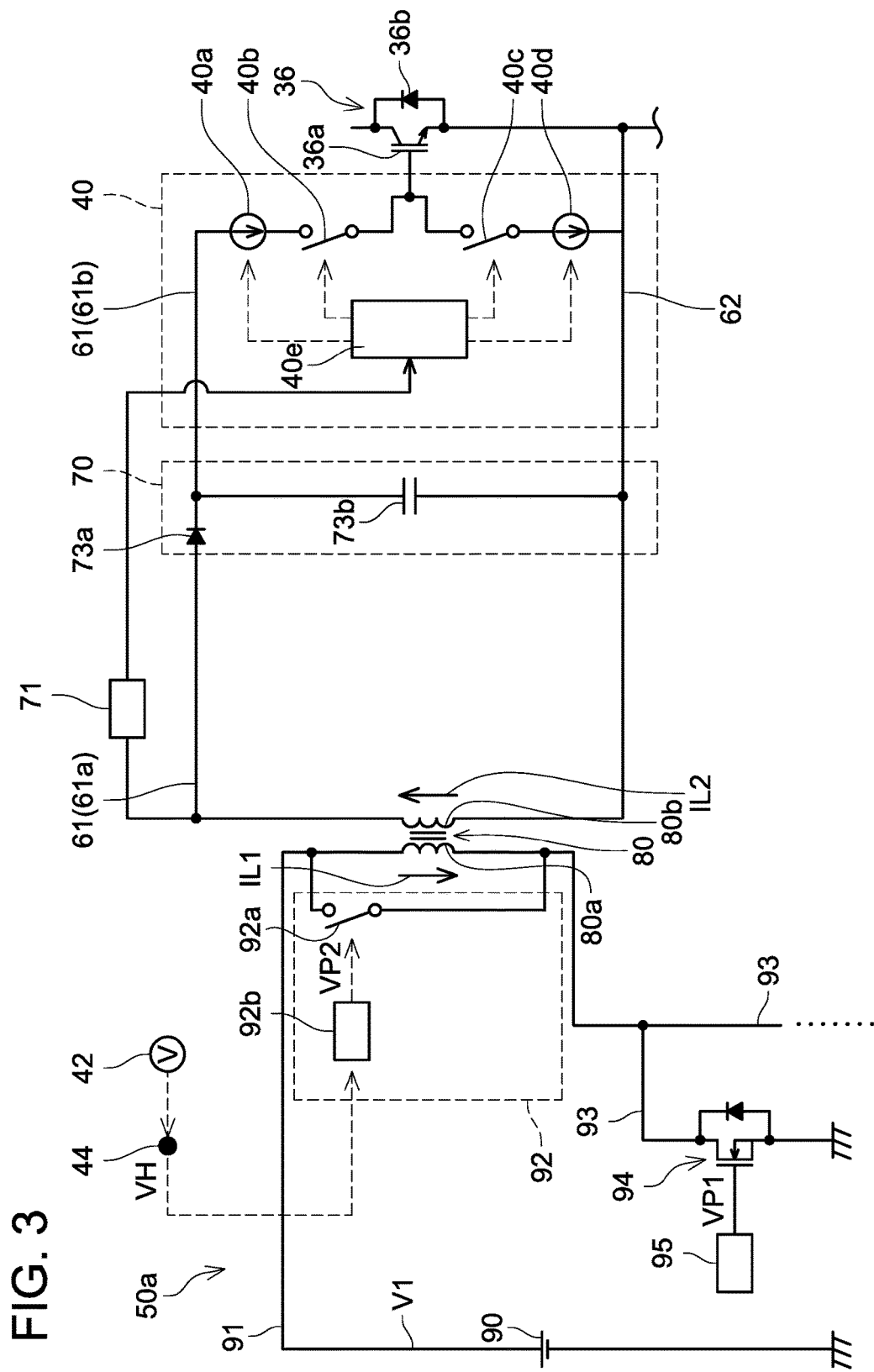
FIG. 3 is a detailed circuit diagram of the gate voltage control circuit 50 of the first embodiment.

FIG. 3 shows details of the primary circuit 50a, the secondary circuits 70, and the voltage regulator circuits 40. Notably, as aforementioned, the gate voltage control circuit 50 includes fourteen sets of isolation transformers 80, secondary circuits 70, and voltage regulator circuits 40, and the configuration of each set is equal to each other. Thus, in FIG. 3, the primary circuit 50a and one set of isolation transformer 80, secondary circuit 70, and voltage regulator circuit 40 are shown in detail.

The signal voltage application circuit 92 includes a switch 92a and a signal transmission control device 92b.

One end of the switch 92a is connected to the wiring 91. The other end of the switch 92a is connected to the wiring 93. That is, the switch 92a is connected between both ends of the primary coil 80a.

The signal transmission control device 92b is connected to a control terminal of the switch 92a. The signal indicating the value of the potential VH is transmitted from the isolation element 44 to the signal transmission control device 92b. The signal transmission control device 92b applies a signal VP2 to the control terminal of the switch 92a according to the received value of the potential VH. By so doing, the signal transmission control device 92b switches the switch 92a. The signal transmission control device 92b applies the signal VP2 in synchrony with the cycle of the pulse signal VP1. That is, the signal transmission control device 92b switches the switch 92a by synchronizing with a switching cycle of the NMOS 94. Accordingly, a switching cycle of the switch 92a is equal to the switching cycle of the NMOS 94. However, a switching pattern of the switch 92a (that is, a waveform of the signal VP2) differs from a switching pattern of the NMOS 94 (that is, a waveform of the pulse signal VP1). Further, the signal transmission control device 92b changes the switching pattern of the switch 92a according to the value of the potential VH.

One end of the secondary coil 80b of the isolation transformer 80 is connected to a wiring 61. The other end of the secondary coil 80b is connected to a wiring 62. The wiring 62 is connected to an emitter of the IGBT 36a.

The secondary circuit 70 includes a diode 73a and a smoothing capacitor 73b. The diode 73a is connected to the wiring 61. The diode 73a is connected in a direction along which its anode is oriented toward the secondary coil 80b. Hereinbelow, the wiring 61 located on an anode side of the diode 73a will be termed a wiring 61a, and the wiring 61 located on a cathode side of the diode 73a will be termed a wiring 61b. The smoothing capacitor 73b is connected between the wiring 61b and the wiring 62.

Further, a detection circuit 71 is connected to each secondary coil 80b. The detection circuit 71 is connected to the wiring 61a. The detection circuit 71 detects a potential of the wiring 61a relative to the wiring 62 (that is, a voltage between both ends of the secondary coil 80b). The detection circuit 71 detects a variable voltage generated between both the ends of the secondary coil 80b, and detects the signal indicating the value of the potential VH from a waveform in each cycle of the detected variable voltage. The detection circuit 71 transmits the signal indicating the value of the potential VH to the voltage regulator circuit 40 based on the detected signal.

The voltage regulator circuit 40 is connected between the wiring 61b and the wiring 62. Further, as aforementioned, the voltage regulator circuit 40 is connected to the gate of the IGBT 36*a*. The voltage regulator circuit 40 includes a constant current power source 40*a*, a switch 40*b*, a switch 40*c*, a constant current power source 40*d*, and a control IC 40*e*. The constant current power source 40*a* and the switch 40*b* are connected serially between the wiring 61 and the gate of the IGBT 36*a*. The constant current power source 40*a* is configured to allow current to flow from the wiring 61 toward the gate of the IGBT 36*a*. The control IC 40*e* is configured capable of changing a magnitude of the current that the constant current power source 40*a* is to provide. The switch 40*b* is connected between the constant current power source 40*a* and the gate of the IGBT 36*a*. The switch 40*b* is controlled by the control IC 40*e*. When the switch 40*b* turns on, current flows from the wiring 61 toward the gate of the IGBT 36*a*. The constant current power source 40*d* and the switch 40*c* are connected serially between the wiring 62 and the gate of the IGBT 36*a*. The constant current power source 40*d* is configured to allow current to flow from the gate of the IGBT 36*a* toward the wiring 62. The control IC 40*e* is configured capable of changing a magnitude of the current that the constant current power source 40*d* is to provide. The switch 40*c* is connected between the gate of the IGBT 36*a* and the constant current power source 40*d*. The switch 40*c* is controlled by the control IC 40*e*. When the switch 40*c* turns on, current flows from the gate of the IGBT 36*a* toward the wiring 62. The control IC 40*e* repeats charging and discharging the gate of the IGBT 36*a* to cyclically change the voltage of the gate of the IGBT 36*a*.

Next, an operation of the gate voltage control circuit 50 will be described. The power supply control device 95 applies a pulse signal VP1 shown in FIG. 4 on the gate of the NMOS 94. The pulse signal VP1 is a pulse signal that shifts between a high potential Von and a low potential Voff. Cycles of the pulse signal VP1 are constant, and a waveform of the pulse signal VP1 in each cycle does not change. The NMOS 94 is controlled to be "on" during an on-period Ton when the pulse signal VP1 is of the high potential Von. The NMOS 94 is controlled to be OFF during an off-period Toff when the pulse signal VP1 is of the low potential Voff. That is, the NMOS 94 repeats to turn on and off at a certain cycle. Since the NMOS 94 is "on" during the on-period Ton, current flows from the wiring 91 to the ground through the primary coils 80*a* and the NMOS 94. Thus, during the on-period Ton, current IL1 flowing in the primary coils 80*a* becomes positive. The current IL1 flowing in the primary coils 80*a* gradually increases during the on-period Ton. Since the current IL1 gradually increases, the primary coils 80*a* generate an electromotive force in a direction inhibiting the current IL1. Thus, during the on-period Ton, when a direction from the wiring 91 toward the wiring 93 is seen as a positive direction, a negative voltage VLLa (a negative voltage having substantially same magnitude as the output voltage V1 of the DC power source 90) is generated between both ends of each primary coil 80*a*. When the NMOS 94 turns off, the current IL1 flowing in the primary coils 80*a* becomes substantially zero. At this occasion, the primary coils 80*a* generate an electromotive force in the direction from the wiring 91 toward the wiring 93. Due to this, during the off-period Toff, a positive voltage VLHa is generated between both ends of each primary coil 80*a*. As described above, the variable voltage VL1 that becomes the negative voltage VLLa during the on-period and becomes the positive voltage VLHa during the off-period is generated between both ends of the primary coils 80*a*. Notably, even during the off-period Toff the voltage VL1 between both ends of each primary coil 80*a* does not become the high voltage VLHa as an exception when the switch 92*a* is turned on. This case will be described later in detail.

Figure 4:
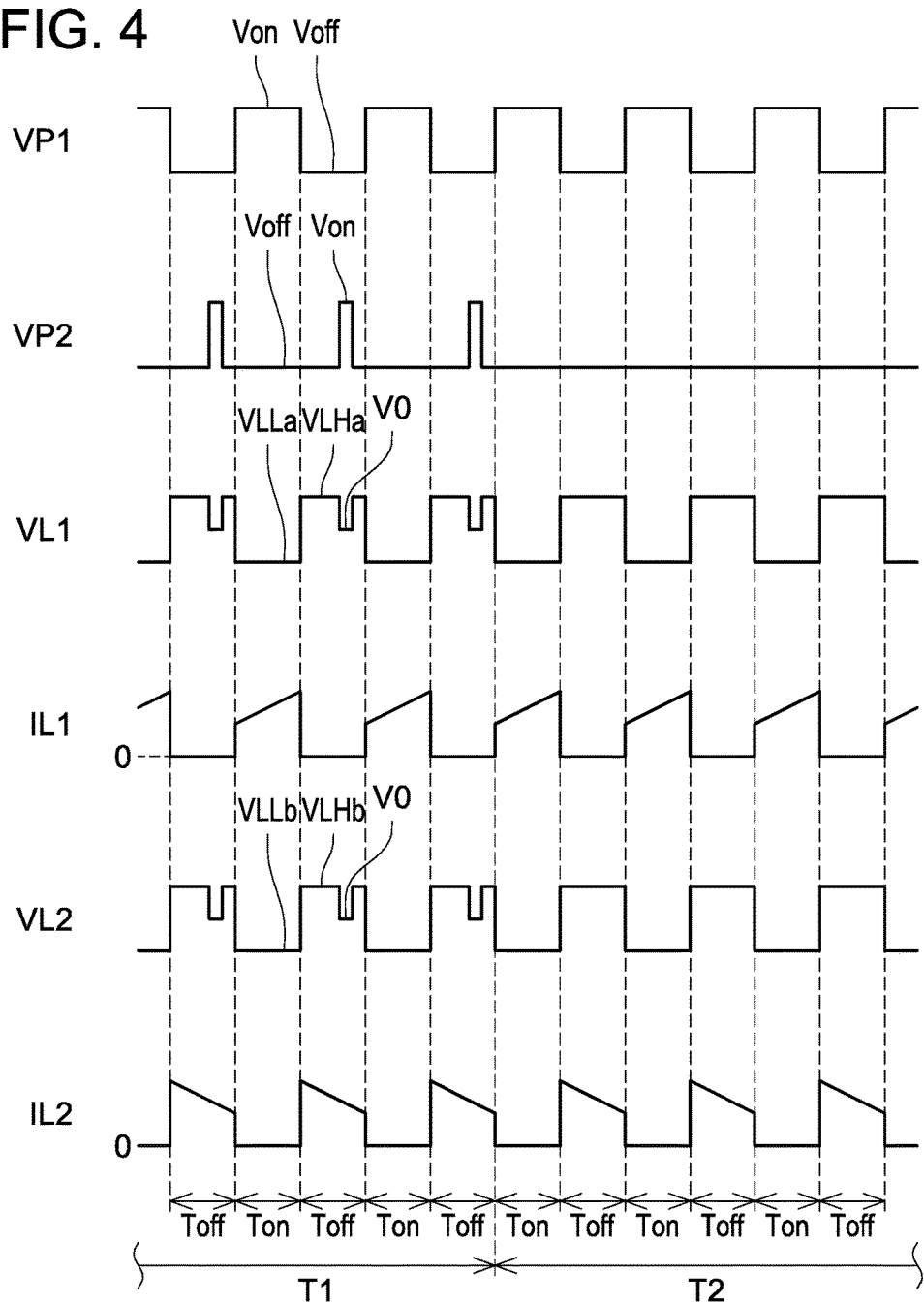
FIG. 4 is a graph showing an operation of the gate voltage control circuit 50 of the first embodiment.

When the variable voltage VL1 as above is generated between both ends of each primary coil 80*a*, a variable voltage VL2 is generated between both ends of each secondary coil 80*b* by a mutual inductance of the primary coil 80*a* and the secondary coil 80*b*. That is, as shown in FIG. 4, the voltage VL2 between both ends of each secondary coil 80*b* changes in substantially same waveform as the voltage VL1 between both ends of each primary coil 80*a*. Thus, the voltage VL2 becomes a low voltage VLLb during the on-period Ton and becomes a high voltage VLHb during the off-period Toff. Notably, when a direction from the wiring 62 toward the wiring 61 is seen as a positive direction, the voltage VLLb is a negative voltage, and the voltage VLHb is a positive voltage. Since the diode 73*a* exists, no current flows in the secondary coil 80*b* while the voltage VL2 is of the negative voltage VLLb (that is, during the on-period Ton). On the other hand, when the voltage V12 is of the positive voltage VLHb (that is, during the off-period Toff), current flows from the wiring 62 to the wiring 61*a* through the secondary coil 80*b*. This current passes through the diode 73*a* and enters into the smoothing capacitor 73*b*. Due to this, the potential of the wiring 61*b* on the cathode side of the diode 73*a* rises.

The smoothing capacitor 73*b* is intermittently charged by the repetition of turning the NMOS 94 on and off and the potential of the wiring 61*a* gradually rises. When the potential of the wiring 61*a* rises to a certain potential, the potential of the wiring 61*a* stabilizes at a high potential. That is, a direct voltage is supplied between the wiring 61*a* and the wiring 62.

The voltage regulator circuit 40 is driven by the DC voltage supplied between the wiring 61*a* and the wiring 62. When the control IC 40*e* turns the switch 40*b* on and turns the switch 40*c* off, charges are supplied from the wiring 61*a* to the gate of the IGBT 36*a* and the IGBT 36*a* turns on. When the control IC 40*e* turns the switch 40*b* off and turns the switch 40*c* on, the charges flow from the gate of the IGBT 36*a* to the wiring 62, and the IGBT 36*a* turns off. As above, the voltage regulator circuit 40 operates by receiving the DC voltage supplied between the wiring 61*a* and the wiring 62.

Further, the switch 92*a* is switched on and off by the signal transmission control device 92*b* controlling a signal VP2 applied to a control terminal of the switch 92*a* during the operation of the gate voltage control circuit 50. The signal transmission control device 92*b* changes the switching pattern of the switch 92*a* based on whether or not the potential VH is greater than a reference value. A period T1 in FIG. 4 shows the operation when the potential VH is greater than the reference value, and a period T2 in FIG. 4 shows the operation when the potential VH is equal to or less than the reference value.

When the potential VH is greater than the reference value, as shown in the period T1 of FIG. 4, the signal transmission control device 92*b* maintains the signal VP2 at the low potential Voff (potential by which the switch 92*a* is turned off) for the entire on-period Ton and a majority of the off-period Toff, and controls the signal VP2 to be at the high potential Von (potential by which the switch 92*a* is turned on) only in a partial period in a latter half of the off-period Toff Due to this, the switch 92*a* turns on in the partial period within the latter half of the off-period Toff. When the switch 92*a* turns on, the two ends of the primary coil 80*a* are short-circuited by the switch 92*a*. Due to this, during when the switch 92*a* is "on", the voltage VL1 between both ends of the primary coil 80a becomes V0, which is equal to substantially zero. The voltage V0 is an intermediate voltage that is lower than the positive voltage VLHa and higher than the negative voltage VLLa. The waveform of the voltage VL2 between both ends of the secondary coil 80b becomes substantially equal to the waveform of the voltage VL1 between both ends of the primary coil 80a, thus, during the period T1, the voltage VL2 comes to be at the intermediate voltage V0 (voltage that is lower than the positive voltage VLHb and higher than the negative voltage VLLb) in a partial period in the latter half of the off-period Toff.

If the potential VH is equal to or lower than the reference value, the signal transmission control device 92b maintains the signal VP2 at the low potential Voff as shown in the period T2 of FIG. 4. That is, the signal VP2 does not become high potential Von. Due to this, during the period T2, the period during which the variable voltage VL1 is maintained at the intermediate voltage V0 does not exist, and also the period during which the variable voltage VL2 is maintained at the intermediate voltage V0 does not exist.

As above, the signal voltage application circuit 92 switches between the operation of generating the intermediate voltage V0 and the operation that does not generate the intermediate voltage V0 depending on whether or not the potential VH is higher than the reference value. Due to this, the waveform of the variable voltage VL2 generated between both ends of the secondary coil 80b changes depending on whether or not the potential VH is higher than the reference value.

The detection circuit 71 detects the variable voltage VL2 generated between both ends of its corresponding secondary coil 80b, and determined whether or not the waveform of the variable voltage VL2 in the respective cycles includes the intermediate voltage V0. The variable voltage VL2 including the intermediate voltage V0 means that the potential VH is higher than the reference value. The variable voltage VL2 not including the intermediate voltage V0 means that the potential VH is equal to or less than the reference value. The detection circuit 71 determines whether or not the potential VH is higher than the reference value based on the waveform of the variable voltage VL2. The detection circuit 71 sends the control IC 40e a signal indicating whether the potential VH is higher than the reference value or not.

If the signal indicating that the potential VH is higher than the reference value is received, the control IC 40e decreases the set current for the constant current power sources 40a, 40d. In so doing, the charge/discharge speed of the gate of the IGBT 36a becomes slower, so the switching speed of the IGBT 36a slows down (a voltage change rate between the collector and emitter upon when the IGBT 36a turns on and off becomes smaller). The control IC 40e switches the IGBT 36a repeatedly at the low switching speed. Due to this, a surge voltage generated in the IGBT 36a is suppressed. Further, if the signal indicating that the potential VH is lower than the reference value is received, the control IC 40e increases the set current for the constant current power sources 40a, 40d. In so doing, the charge/discharge speed of the gate of the IGBT 36a becomes faster, so the switching speed of the IGBT 36a speeds up (the voltage change rate between the collector and emitter upon when the IGBT 36a turns on and off becomes larger). The control IC 40e switches repeatedly the IGBT 36a at the fast switching speed. If the potential VH is low, an allowance for the surge voltage generated in the IGBT 36a becomes larger, thus the switching speed can be increased. By increasing the switching speed, the loss generated in the IGBT 36a can be suppressed.

As described above, by using the gate voltage control circuit 50, power can be supplied from the primary coil 80a to the secondary coil 80b, and the signal indicating the potential VH can be transmitted from the primary coil 80a to the secondary coil 80b. Thus, the switching speed of each IGBT 36a can be changed according to the potential VH.

Notably, each of the voltage regulator circuits 40 is connected to the emitter of its corresponding IGBT 36a, and it operates with a potential of the emitter as a reference thereof. Since the potential of the emitter differs for each IGBT 36a, the reference potential of each voltage regulator circuit 40 differs from one another. Further, the detection circuit 42 operates with a potential higher than those of the respective voltage regulator circuits 40. In such a case, if a signal is to be transmitted from the detection circuit 42 to the respective voltage regulator circuits 40, an isolation element would be necessary for each voltage regulator circuit 40. In such a case, due to a large size of the isolation elements, the gate voltage control circuit 50 becomes large. In regards to this, by using the gate voltage control circuit 50 of the embodiment, although the isolation element 44 is provided on the signal transmission passage from the detection circuit 42 to the primary circuit 50a, the signal indicating the potential VH can be transmitted from the primary circuit 50a to the respective voltage regulator circuits 40 without using isolation elements dedicated to signal transmission. That is, the signal indicating the potential VH can be transmitted from the primary circuit 50a to the respective voltage regulator circuits 40 through the isolation transformers 80 for power supply. According to the above configuration, the isolation transformers 80 can be endowed with a function of transmitting the signal indicating the potential VH. Thus, according to this configuration, isolation elements dedicated to signal transmission do not need to be used for the respective voltage regulator circuits 40, and the gate voltage control circuit can be made compact. Especially the gate voltage control circuit 50 can omit fourteen isolation elements, since it includes fourteen voltage regulator circuits 40. Due to this, the gate voltage control circuit 50 can achieve a significant reduction in its size.

Second Embodiment

A gate voltage control circuit of the second embodiment differs from the gate voltage control circuit of the first embodiment in the operation of the signal transmission control device 92b. Other configurations of the gate voltage control circuit of the second embodiment are same as those of the gate voltage control circuit of the first embodiment.

Figure 5:
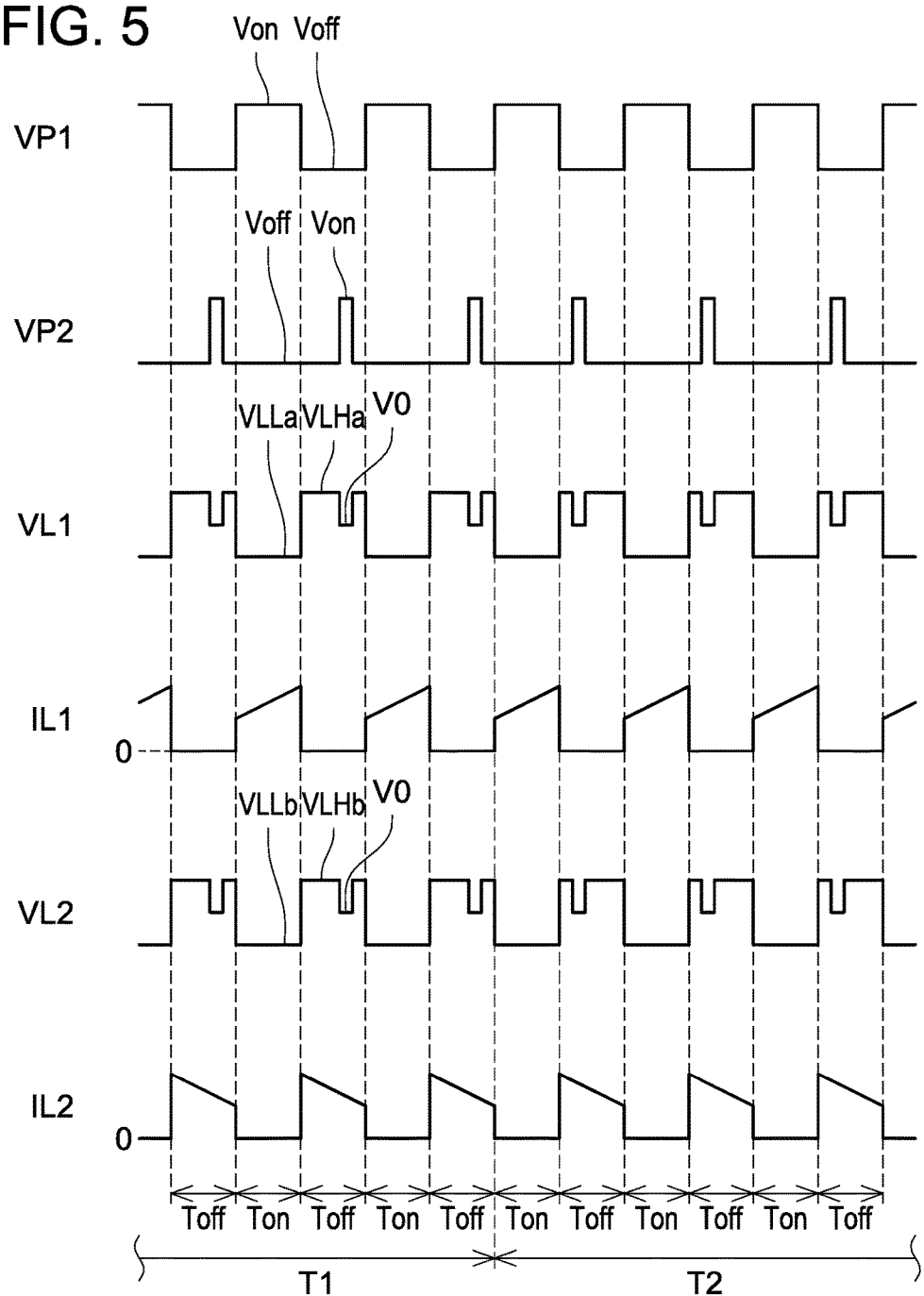
FIG. 5 is a graph showing an operation of a gate voltage control circuit of a second embodiment.

FIG. 5 shows an operation of the gate voltage control circuit of the second embodiment. The operation of the gate voltage control circuit of the second embodiment during the period T1 (when the potential VH is larger than the reference value) is same as that of the gate voltage control circuit 50 of the first embodiment. The operation of the gate voltage control circuit of the second embodiment during the period T2 (when the potential VH is equal to or less than the reference value) is different from that of the gate voltage control circuit 50 of the first embodiment.

In the second embodiment, the signal transmission control device 92b controls the signal VP2 to be at the high potential Von during the period T2 in a partial period in a former half of the off-period Toff Due to this, during the period T2, the variable voltage VL1 comes to be of the intermediate voltage V0 and the variable voltage VL2 comes to be of the intermediate voltage V0 during the partial period in the former half of the off-period Toff. Since, even with such a configuration, a difference will be generated in the waveforms in the respective cycles of the variable voltage VL2 during the period T1 and the period T2, the detection circuit 71 can still determine the magnitude of the potential VH from the waveform of the variable voltage VL2. Accordingly, the switching speed of the IGBT 36a can be changed according to the magnitude of the potential VH in the second embodiment as well.

As above, the signal indicating the potential VH can be transmitted even by changing the timing at which the intermediate voltage is applied (phase of the signal VP2 relative to the pulse signal VP1).

Notably, in the second embodiment, a ratio of the period during which the waveform of the variable voltage VL2 is maintained at the high voltage VLHb during the period T1 and a ratio of the period during which the waveform of the variable voltage VL2 is maintained at the high voltage VLHb during the period T2 are equal. Further, a ratio of the period during which the waveform of the variable voltage VL2 is maintained at the intermediate voltage V0 during the period T1 and a ratio of the period during which the waveform of the variable voltage VL2 is maintained at the intermediate voltage V0 during the period T2 are equal. Due to this, a value obtained by integrating a one-cycle worth of variable voltage VL2 by time is equal between the period T1 and the period T2. Due to this, a difference is less likely to occur in the energy supplied to the voltage regulator circuits 40 between the period T1 and the period T2. Due to this, according to the configuration of the second embodiment, the power can be supplied to the voltage regulator circuits 40 with greater stability.

Notably, the signal may be transmitted by changing a duration of the period of maintaining the signal VP2 at the high potential Von. That is, any method may be used so long as the waveform of the variable voltage VL2 changes according to the potential VH.

Third Embodiment

In the gate voltage control circuits 50 of the first and second embodiments, there may be some cases where detection of the intermediate voltage by the detection circuit 71 becomes difficult due to the generation of ringing. The gate voltage control circuit of the third embodiment suppresses an influence of the ringing and ensures the detection of the intermediate voltage. Firstly, issues related to the ringing will be described.

Figure 6:
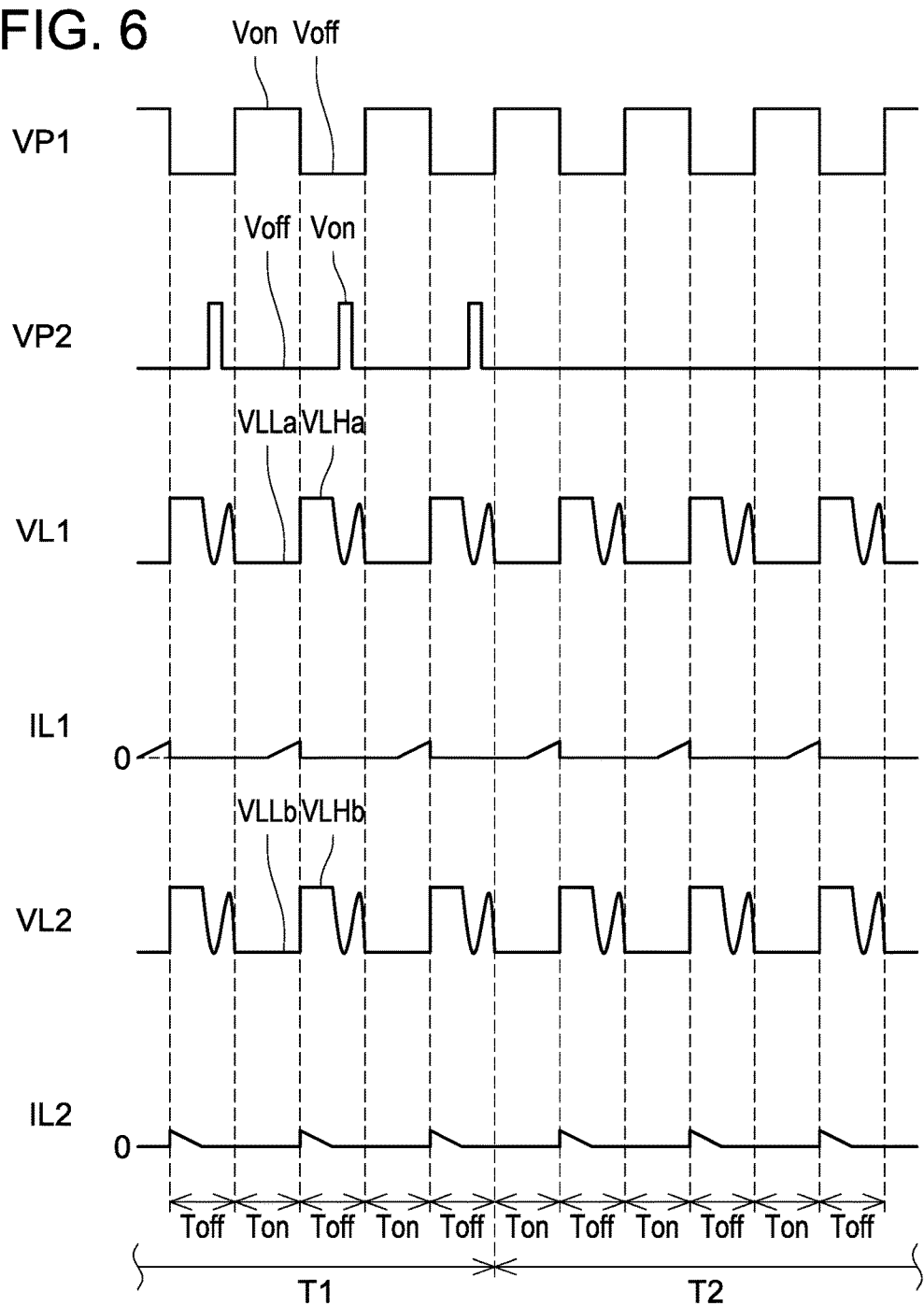
FIG. 6 is a graph showing ringing.

In the gate voltage control circuit 50 of the first embodiment, if sufficient charges are stored in the smoothing capacitors 73b, the current IL1 flowing in the primary coils 80a and the current IL2 flowing in the secondary coils 80b become small as shown in FIG. 6. In this case, the current IL2 attenuates to zero in a midst of the off-period Toff. Then, the ringing is generated at the timing when the current IL2 had attenuated to zero, and the voltages VL1, VL2 greatly fluctuate. Due to this, the detection circuit 71 cannot detect the intermediate voltage V0. Same issue may rise in the gate voltage control circuit 50 of the second embodiment as well.

Figure 7:
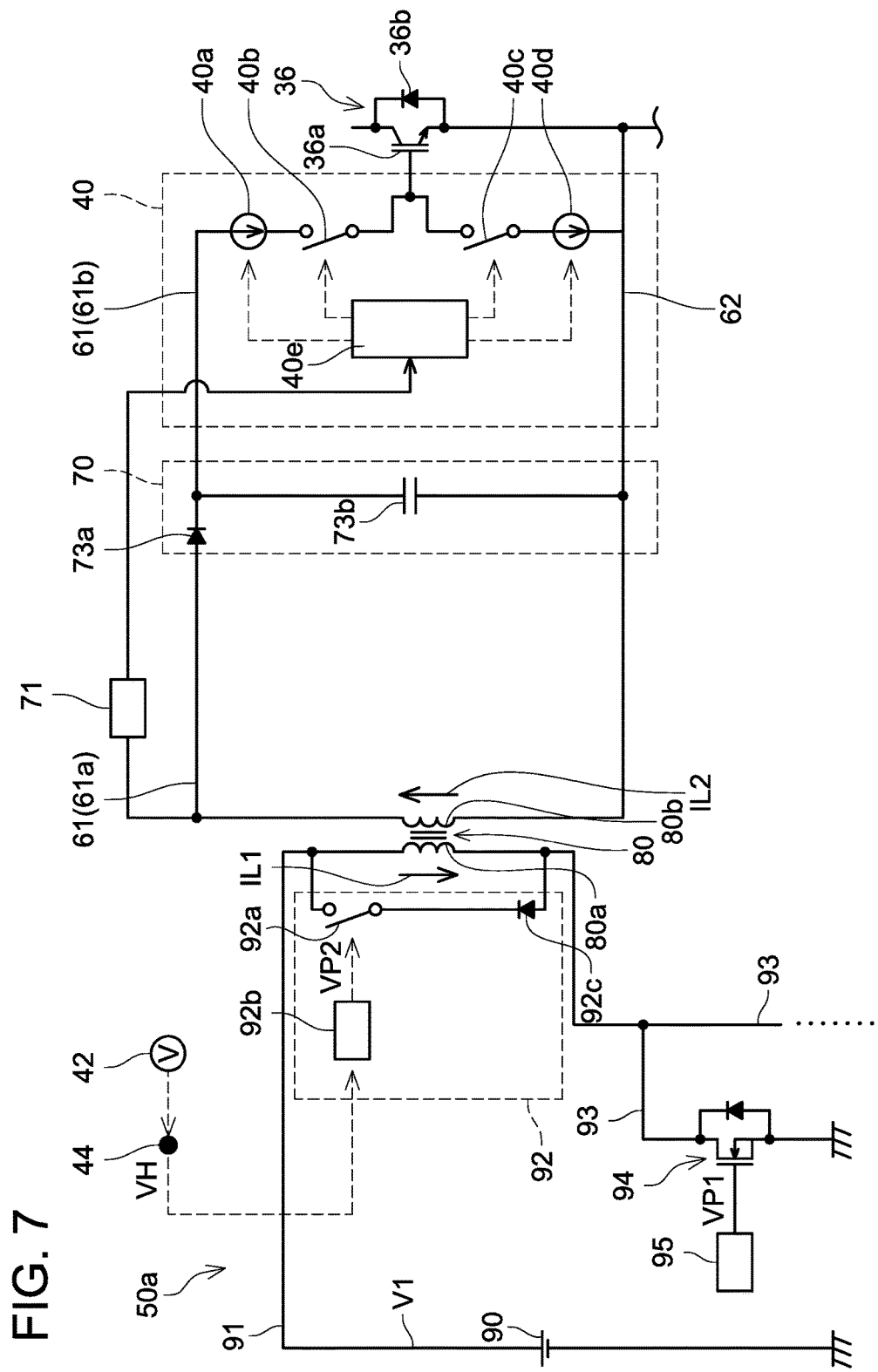
FIG. 7 is a detailed circuit diagram of a gate voltage control circuit of a third embodiment.

Next, the gate voltage control circuit of the third embodiment will be described. As shown in FIG. 7, the gate voltage control circuit of the third embodiment includes a diode 92c connected serially to the switch 92a. That is, a serial circuit of the switch 92a and the diode 92c is connected in parallel to the respective primary coils 80a. The diode 92c is connected so as to have its cathode oriented toward the positive electrode of the DC power source 90, and its anode oriented toward the negative electrode of the DC power source 90. Notably, in FIG. 7, the diode 92c is connected between the switch 92a and the wiring 93, however, the diode 92c may be connected between the switch 92a and the wiring 91. Further, in the gate voltage control circuit of the third embodiment, the operation of the signal transmission control device 92b differs from the gate voltage control circuit 50 of the first embodiment. Other configurations of the gate voltage control circuit of the third embodiment are equal to those of the gate voltage control circuit of the first embodiment.

Figure 8:
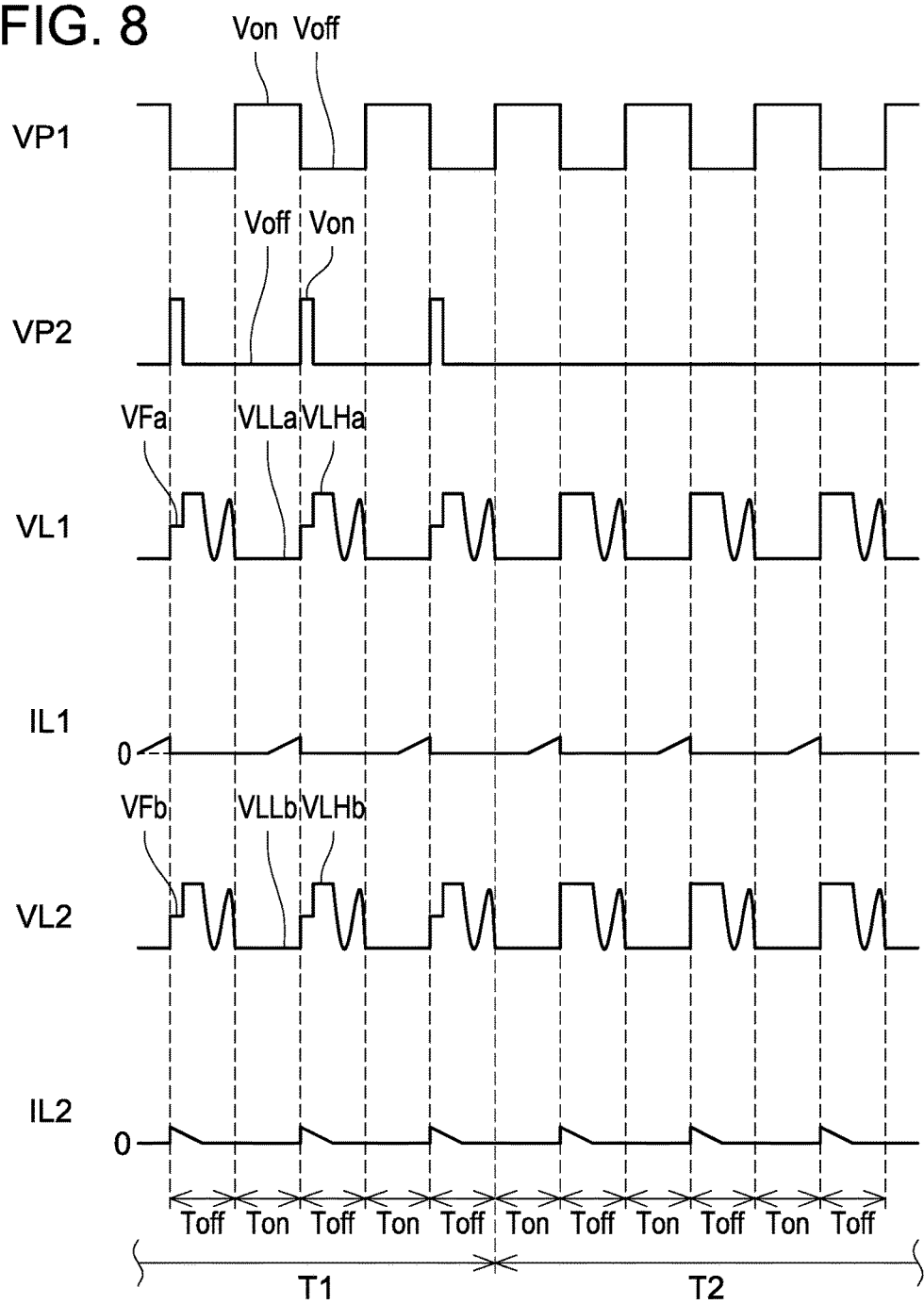
FIG. 8 is a graph showing an operation of the gate voltage control circuit of the third embodiment.

FIG. 8 shows the operation of the gate voltage control circuit of the third embodiment. The operation of the gate voltage control circuit of the third embodiment during the period T2 (when the potential VH is equal to or less than the reference value) is equal to that of the gate voltage control circuit 50 of the first embodiment. The operation of the gate voltage control circuit of the third embodiment during the period T1 (when the potential VH is greater than the reference value) is different from that of the gate voltage control circuit 50 of the first embodiment.

In the third embodiment, when the signal VP2 is controlled to be of the high potential Von and the switch 92a turns on, the voltage VL1 between both ends of each primary coil 80a becomes an intermediate voltage VFa that is substantially equal to a forward voltage drop of the diode 92c. Thus, at this occasion, the voltage VL2 between both ends of each secondary coil 80b becomes an intermediate voltage VFb that corresponds to the intermediate voltage VFa.

In the third embodiment, the signal transmission control device 92b controls the signal VP2 to be of the high potential Von at the beginning of the off-period Toff in the period T1. Due to this, during the period T1, the variable voltage VL1 is the intermediate voltage VFa and the variable voltage VL2 is the intermediate voltage VFb at the beginning of the off-period Toff. That is, a shape of a rising edge of the variable voltage VL2 in each cycle comes to have a shape that rises from the voltage VLLb to the intermediate voltage VFb, then maintained at the intermediate voltage VFb, and then rises from the intermediate voltage VFb to the voltage VLHb. On the other hand, the shape of the rising edge of the variable voltage VL2 in each cycle in the period T2 is a shape that linearly rises from the voltage VLLb to the voltage VLHb. As above, the shape of the rising edge of the variable voltage VL2 changes according to the potential VH. The current IL2 flows at all time in the rising edge of the variable voltage VL2. Due to this, the ringing does not occur in the rising edge of the variable voltage VL2. Thus, the detection circuit 71 can surely determine the presence/absence of the intermediate voltage VFb at the rising edge. Due to this, according to the gate voltage control circuit of the third embodiment, the signal indicating the potential VH can surely be transmitted even in cases where the currents IL1, IL2 are low.

Notably, according to the configuration of the third embodiment, the switch 92a needs to turn on substantially concurrent to turning the NMOS 94 off at the rising edges of the variable voltages VL1, VL2 in the period T1. In such a case, if the timing to turn the NMOS 94 off is delayed, or if the timing to turn the switch 92a on becomes earlier, there will be a state in which both the NMOS 94 and the switch 92a are turned on despite such a period being of a very short time. However, in the configuration of the third embodiment, due to the diode 92c being serially connected to the switch 92a, the diode 92c prevents the short circuiting of the positive electrode and the negative electrode of the DC power source 90 even in the event where both of the NMOS 94 and the switch 92a are turned on. Due to this, an excessive load is prevented from being applied to the DC power source 90. Notably, due to an influence such as noise, there is a risk that both of the NMOS 94 and the switch 92a may be turned on. Thus, the diode 92c for short-circuit prevention may be employed in the first and second embodiments, or in other embodiments to be described below.

Fourth Embodiment

Figure 9:
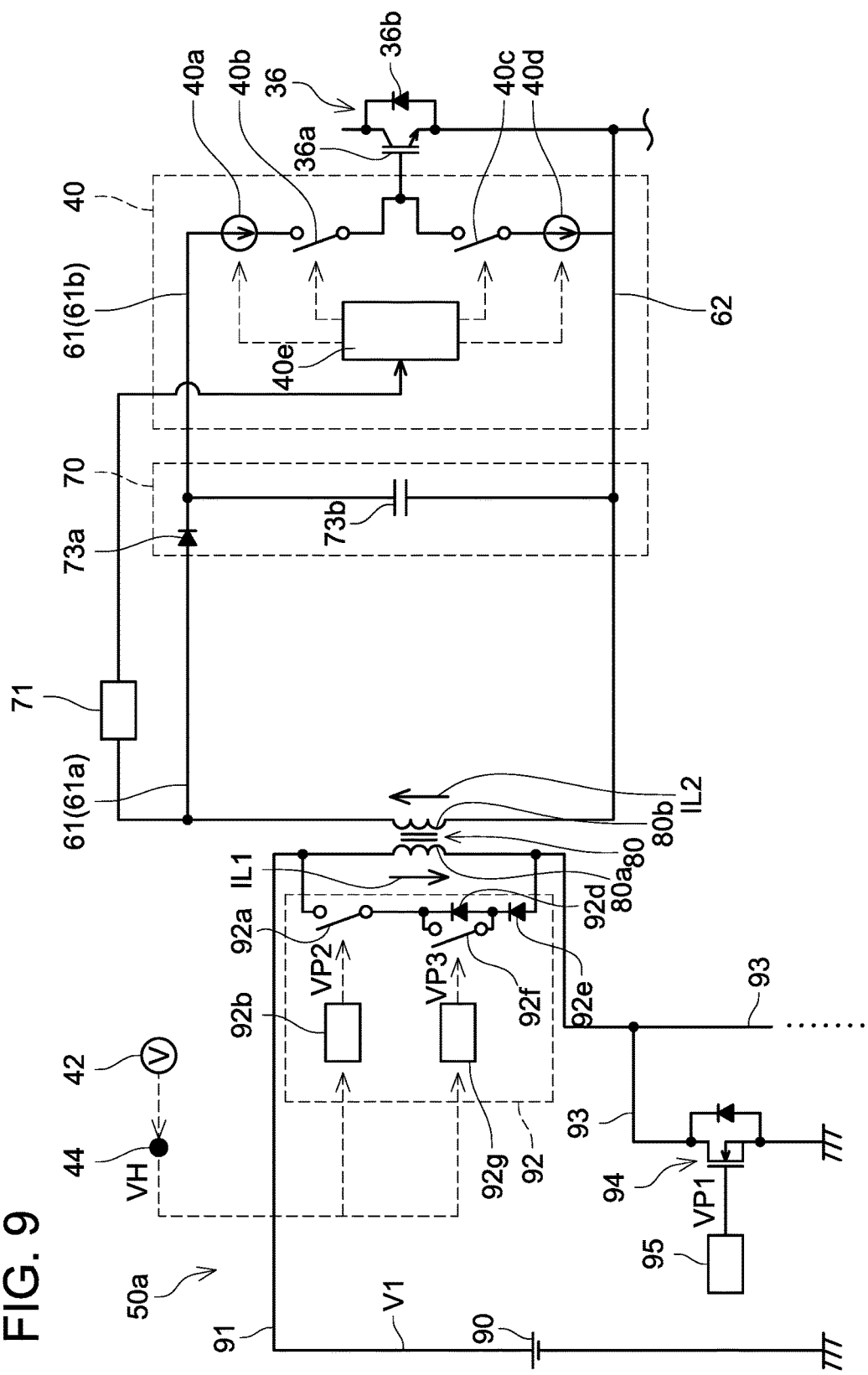
FIG. 9 is a detailed circuit diagram of a gate voltage control circuit of a fourth embodiment.

As shown in FIG. 9, the gate voltage control circuit of the fourth embodiment includes two diodes 92d, 92e connected serially to the switch 92a. That is, a serial circuit of the switch 92a and the diodes 92d, 92e is connected in parallel to the respective primary coils 80a. The diode 92d is connected so as to have its cathode oriented toward the positive electrode of the DC power source 90, and its anode oriented toward the negative electrode of the DC power source 90. The diode 92e is connected so as to have its cathode oriented toward the positive electrode of the DC power source 90, and its anode oriented toward the negative electrode of the DC power source 90. Notably, in FIG. 9, the diodes 92d, 92e are connected between the switch 92a and the wiring 93, however, an order by which the switch 92a, the diode 92d, and the diode 92e are arranged may be of any order.

A switch 92f is connected between the anode and the cathode of the diode 92d. A signal transmission control device 92g is connected to a control terminal of the switch 92f The signal indicating the value of the potential VH is transmitted from the isolation element 44 to the signal transmission control device 92g. The signal transmission control device 92g applies a signal VP3 to the control terminal of the switch 92f according to the value of the received potential VH.

Figure 10:
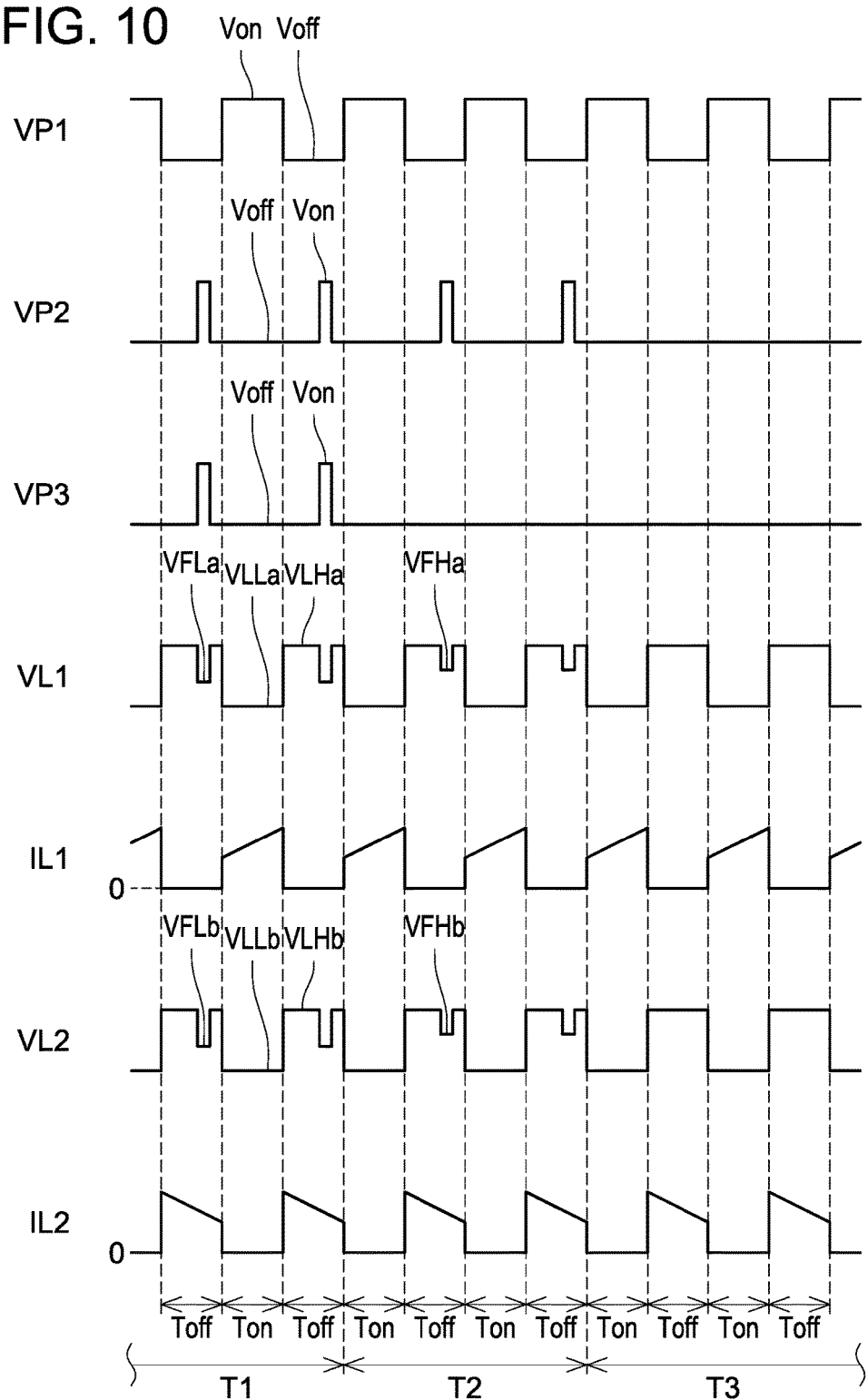
FIG. 10 is a graph showing an operation of the gate voltage control circuit of the fourth embodiment.

FIG. 10 shows an operation of the gate voltage control circuit of the fourth embodiment. In the fourth embodiment, signals are transmitted from the primary circuit 50a to each voltage regulator circuit 40 depending on three cases, namely a case where the potential VH is in a first range greater than a first reference value, a case where the potential VH is in a second range equal to or less than the first reference value but greater than a second reference value, and a case where the potential VH is in a third range equal to or less than the second reference value. The period T1 in FIG. 10 shows the operation for the case of the first range, the period T2 of FIG. 10 shows the operation for the case of the second range, and a period T3 of FIG. 10 shows the operation for the case of the third range.

When the potential VH is in the first range (period T1), the signal transmission control device 92b controls the signal VP2 to be of the high potential Von during a partial period in the latter half of the off-period Toff. Further, in this case, the signal transmission control device 92g controls the signal VP3 to be of the high potential Von during the partial period in the latter half of the off-period Toff Thus, in the period T1, the switch 92a and the switch 92f turn on during the partial period in the latter half of the off-period Toff. When the switch 92f turns on, the anode and the cathode of the diode 92d are short circuited. Further, when the switch 92a turns on, both ends of each primary coil 80a are connected by the switch 92a, the switch 92f and the diode 92e. Thus, during the period T1, the voltage VL1 between both ends of each primary coil 80a becomes voltage VFLa, which is substantially equal to the forward voltage drop of the diode 92e during the partial period in the latter half of the off-period Toff. Due to this, at this timing, the voltage VL2 between both ends of each secondary coil 80b becomes voltage VFLb, which corresponds to the voltage VFLa.

When the potential VH is in the second range (period T2), the signal transmission control device 92b controls the signal VP2 to be of the high potential Von during a partial period in the latter half of the off-period Toff. Thus, the switch 92a turns on during the partial period in the latter half of the off-period Toff. On the other hand, in such a case, the signal transmission control device 92g maintains the signal VP3 at the low potential Voff over the entire off-period Toff Thus, the switch 92f is maintained off over the entire off-period Toff Due to this, in this case, both ends of each primary coil 80a are connected by the switch 92a, the diode 92d, and the diode 92e by the switch 92a turning on. Accordingly, the voltage VL1 between both ends of each primary coil 80a becomes voltage VFHa during the partial period in the latter half of the off-period Toff, which adds the forward voltage drop of the diode 92d and the forward voltage drop of the diode 92e. That is, the intermediate voltage VFHa in the period T2 becomes larger than the intermediate voltage VFLa in the period T1. Due to this, the voltage VL2 generated in the secondary coils 80b also becomes intermediate voltage VFHb, which is higher than the intermediate voltage VFLb.

When the potential VH is in the third range (period T3), the signal transmission control device 92b maintains the signal VP2 to be of the low potential Voff over the entire off-period Toff, and the signal transmission control device 92g maintains the signal VP3 to be of the low potential Voff over the entire off-period Toff. Thus, the variable voltages VL1, VL2 do not have any intermediate voltage during the period T3.

The detection circuit 71 detects the variable voltage VL2 between both ends of its corresponding secondary coil 80b, and determines whether the variable voltage VL2 has the intermediate voltage VFLb, the intermediate voltage VFHb, or no intermediate voltage. Due to this, the detection circuit 71 determines which of the first, second, and third ranges the potential VH is in. Based on the determination result thereof, each voltage regulator circuit 40 changes the switching speed of its corresponding IGBT 36a. That is, if the potential VH is in the first range (i.e., high), the switching speed of the IGBT 36a is set to slow speed. If the potential VH is in the second range (i.e., intermediate), the switching speed of the IGBT 36a is set to intermediate speed. If the potential VH is in the third range (i.e., low), the switching speed of the IGBT 36a is set to fast speed.

As above, according to the configuration of the fourth embodiment, the magnitude of the intermediate voltage can be used as the signal. According to this configuration, information in greater detail can be transmitted to the voltage regulator circuits 40, thus the IGBTs 36a can be controlled with greater sensitivity.

Notably, the diode 92e may be omitted in the fourth embodiment.

Fifth Embodiment

Figure 11:
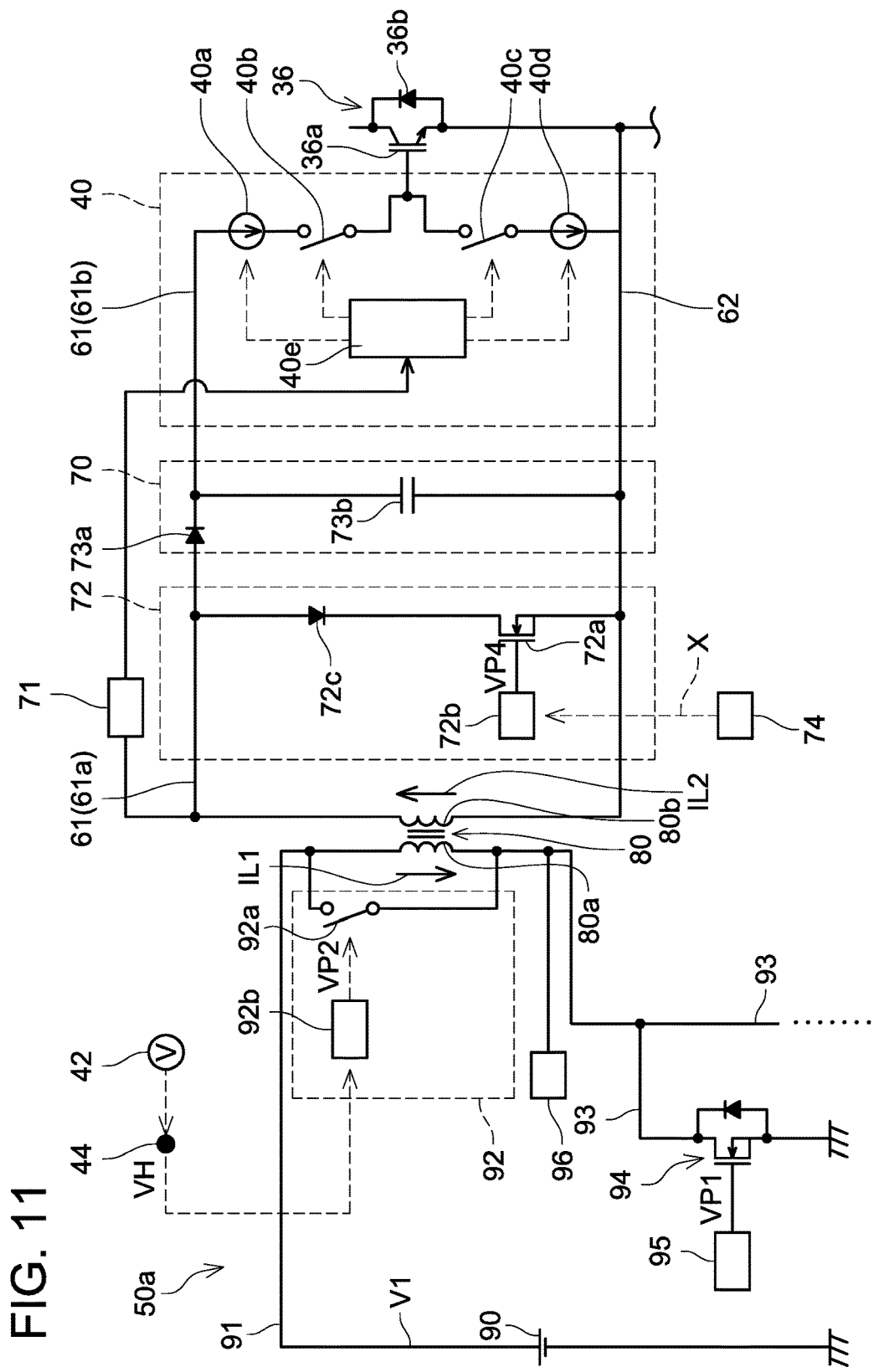
FIG. 11 is a detailed circuit diagram of a gate voltage control circuit of a fifth embodiment.

As shown in FIG. 11, the gate voltage control device of the fifth embodiment includes signal generating circuits 72 and characteristic detectors 74. Further, in the fifth embodiment, the primary circuit 50a includes a waveform detection circuit 96.

Each of the characteristic detectors 74 detects one of characteristics of a circuit connected to its corresponding secondary coil 80b. For example, the characteristic detector 74 may detect a value indicating whether or not an error is occurring in its corresponding voltage regulator circuit 40. Hereinbelow, a characteristic detected by the characteristic detector 74 is termed a characteristic X.

Each of the signal generating circuits 72 is connected between the wiring 61a and the wiring 62. That is, the signal generating circuit 72 is connected in parallel to its corresponding secondary coil 80b. The signal generating circuit 72 includes an NMOS 72a, a signal transmission control device 72b, and a diode 72c.

A source of the NMOS 72a is connected to the wiring 62. A drain of the NMOS 72a is connected to a cathode of the diode 72c. An anode of the diode 72c is connected to the wiring 61a. That is, the NMOS 72a and the diode 72c are connected serially between the wiring 61a and the wiring 62 (that is, between both ends of the secondary coil 80b). The diode 72c is connected so as to have its cathode oriented toward the wiring 62, and its anode oriented toward the wiring 61a.

The signal transmission control device 72b is connected to a gate of the NMOS 72a. The signal transmission control device 72b switches the NMOS 72a by applying a signal VP4 to the gate of the NMOS 72a. A value of the characteristic X is transmitted from the characteristic detector 74 to the signal transmission control device 72b. The signal transmission control device 72b switches the NMOS 72a according to the value of the received characteristic X. The signal transmission control device 72b switches the NMOS 72a by synchronizing with the cycle of the variable voltage VL2 detected by the detection circuit 71. That is, the switching cycle of the NMOS 72a is equal to the cycle of the variable voltage VL2. Further, the signal transmission control device 72b changes a switching pattern of the NMOS 72a according to the value of the characteristic X.

The waveform detection circuit 96 detects a potential of the wiring 93 with the ground as the reference. The potential detected by the waveform detection circuit 96 matches a value obtained by subtracting the output voltage V1 (fixed value) of the DC power source 90 from the voltage VL1 between both ends of the primary coil 80a. Thus, the waveform detection circuit 96 substantially detects the voltage VL1 between both ends of the primary coil 80a.

Other configurations of the gate voltage control circuit of the fifth embodiment are equal to those of the gate voltage control circuit 50 of the first embodiment.

Figure 12:
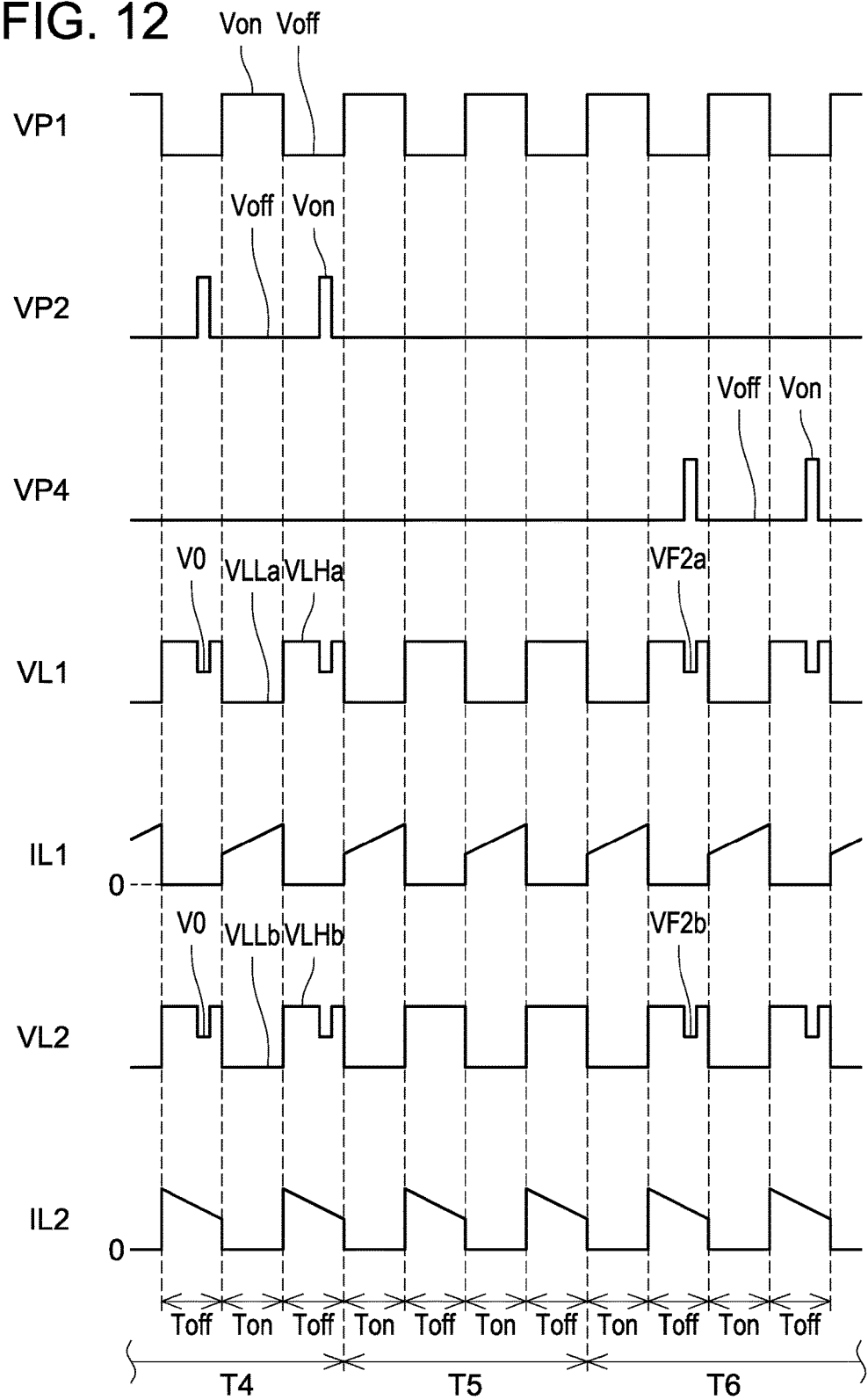
FIG. 12 is a graph showing an operation of the gate voltage control circuit of the fifth embodiment.

FIG. 12 shows the operation of the gate voltage control circuit of the fifth embodiment. A period T4 in FIG. 12 shows a case where the potential VH is greater than the reference value and the characteristic X is equal to or less than its reference value. Since the potential VH is greater than the reference value, the signal voltage application circuit 92 controls the signal VP2 similar to the period T1 of FIG. 4. Thus, in the period T4, the signal VP2 is controlled to the high potential Von in each partial period in the latter half of the off-period Toff. Further, when the characteristic X is equal to or less than the reference value, the signal generating circuit 72 maintains the signal VP4 at the low potential Voff at all times. Thus, during the period T4, the NMOS 72a is kept off at all times. Accordingly, in the period T4 of the fifth embodiment, the waveforms of the voltages VL1, VL2 become similar to the waveforms in the period T1 of the first embodiment. That is, during the period T4, the voltages VL1, VL2 become intermediate voltage V0 in the partial period in the latter half of the off-period Toff.

A period T5 in FIG. 12 shows a case where the potential VH is equal to or less than the reference value and the characteristic X is equal to or less than its reference value. Since the potential VH is equal to or less than the reference value, the signal voltage application circuit 92 controls the signal VP2 to be of the low potential Voff similar to the period T2 of FIG. 4. Thus, in the period T5, the switch 92a is kept off at all times. Further, since the characteristic X is equal to or less than the reference value, the signal generating circuit 72 maintains the signal VP4 at the low potential Voff at all times similar to the period T4. Thus, during the period T5, the NMOS 72a is kept off at all times. Accordingly, in the period T5 of the fifth embodiment, the waveforms of the voltages VL1, VL2 become similar to the waveforms in the period T2 of the first embodiment. That is, during the period T5, the voltages VL1, VL2 do not have any intermediate voltage.

A period T6 in FIG. 12 shows a case where the potential VH is equal to or less than the reference value and the characteristic X is greater than its reference value. Since the potential VH is equal to or less than the reference value, the signal voltage application circuit 92 controls the signal VP2 to be of the low potential Voff. Thus, in the period T6, the switch 92a is kept off at all times. Further, when the characteristic X is greater than the reference value, the signal generating circuit 72 controls the signal VP4 to be of the high potential Von in each partial period in the latter half of the off-period Toff. Thus, the NMOS 72a turns on during each partial period in the latter half of the off-period Toff. When the NMOS 72a turns on, both ends of the secondary coil 80b are connected by the NMOS 72a and the diode 72c. At this occasion, the voltage VL2 between both ends of the secondary coil 80b becomes voltage VF2b, which is substantially equal to the forward voltage drop of the diode 72c. Due to this, the voltage VL1 between both ends of each primary coil 80a becomes voltage VF2a corresponding to the voltage VF2b. Notably, the voltages VF2a, VF2b are extremely small voltages, and are substantially equal to the voltage V0. Accordingly, during the period T6, the waveforms of the voltages VL1, VL2 become substantially similar to those of the period T4.

In the fifth embodiment, the detection circuit 71 detects the voltage VL2 between both ends of the secondary coil 80b and determines whether or not the waveform of the voltage VL2 in each cycle includes an intermediate voltage. Notably, in the fifth embodiment, the voltage VL2 has the intermediate voltage in both cases where the potential VH is greater than the reference value (for example, period T4 in FIG. 12) and where the characteristic X is greater than the reference value (for example, period T6 in FIG. 12). Due to this, whether the potential VH is greater than the reference value or not cannot be determined merely from the presence/absence of the intermediate voltage. Due to this, in the fifth embodiment, the value of the characteristic X is sent from the characteristic detector 74 to the detection circuit 71. The detection circuit 71 determines whether or not the characteristic X is higher than the reference value. When the characteristic X is lower than the reference value and the voltage VL2 has the intermediate voltage, the detection circuit 71 determines that the potential VH is greater than the reference value. In other cases, the detection circuit 71 determines that the potential VH is equal to or less than the reference value. As above, according to the configuration of the fifth embodiment, the switching speed of each IGBT 36a can be changed depending on whether or not the potential VH is greater than the reference value.

Further, in the fifth embodiment, the waveform detection circuit 96 detects the voltage VL1 between both ends of each primary coil 80a and determines whether or not the waveform of the voltage VL1 in each cycle includes an intermediate voltage. Due to this, the waveform detection circuit 96 determines whether or not the characteristic X is greater than the reference value. Notably, in the fifth embodiment, the voltage VL1 has the intermediate voltage in both cases where the potential VH is greater than the reference value (for example, period T4 in FIG. 12) and where the characteristic X is greater than the reference value (for example, period T6 in FIG. 12). Due to this, whether the characteristic X is greater than the reference value or not cannot be determined merely from the presence/absence of the intermediate voltage. Due to this, in the fifth embodiment, the value of the potential VH is sent from the isolation element 44 to the waveform detection circuit 96. The waveform detection circuit 96 determines whether or not the potential VH is higher than the reference value. The waveform detection circuit 96 determines that the characteristic X is greater than the reference value if the potential VH is lower than the reference value and the voltage VL1 has the intermediate voltage. In other cases, the waveform detection circuit 96 determines that the characteristic X is equal to or less than the reference value. As above, according to the configuration of the fifth embodiment, the primary circuit 50a can receive information on whether or not the characteristic X is greater than the reference value.

As described above, according to the configuration of the fifth embodiment, the signal indicating the potential VH can be transmitted from the primary circuit 50a to each voltage regulator circuit 40. Further, according to the configuration of the fifth embodiment, the signal indicating the characteristic X can be sent from the circuits on the secondary coil 80b side to the primary circuit 50a.

Notably, in the fifth embodiment, the signal generating circuit 72 included the diode 72c, however, the signal generating circuit 72 may not include the diode 72c. Further, positions of the NMOS 72a and the diode 72c may be replaced.

Further, the signal generating circuit 72 may be provided to all of the secondary coils 80b, or the signal generating circuit 72 may be provided to only one of the secondary coils 80b.

Sixth Embodiment

Figure 13:
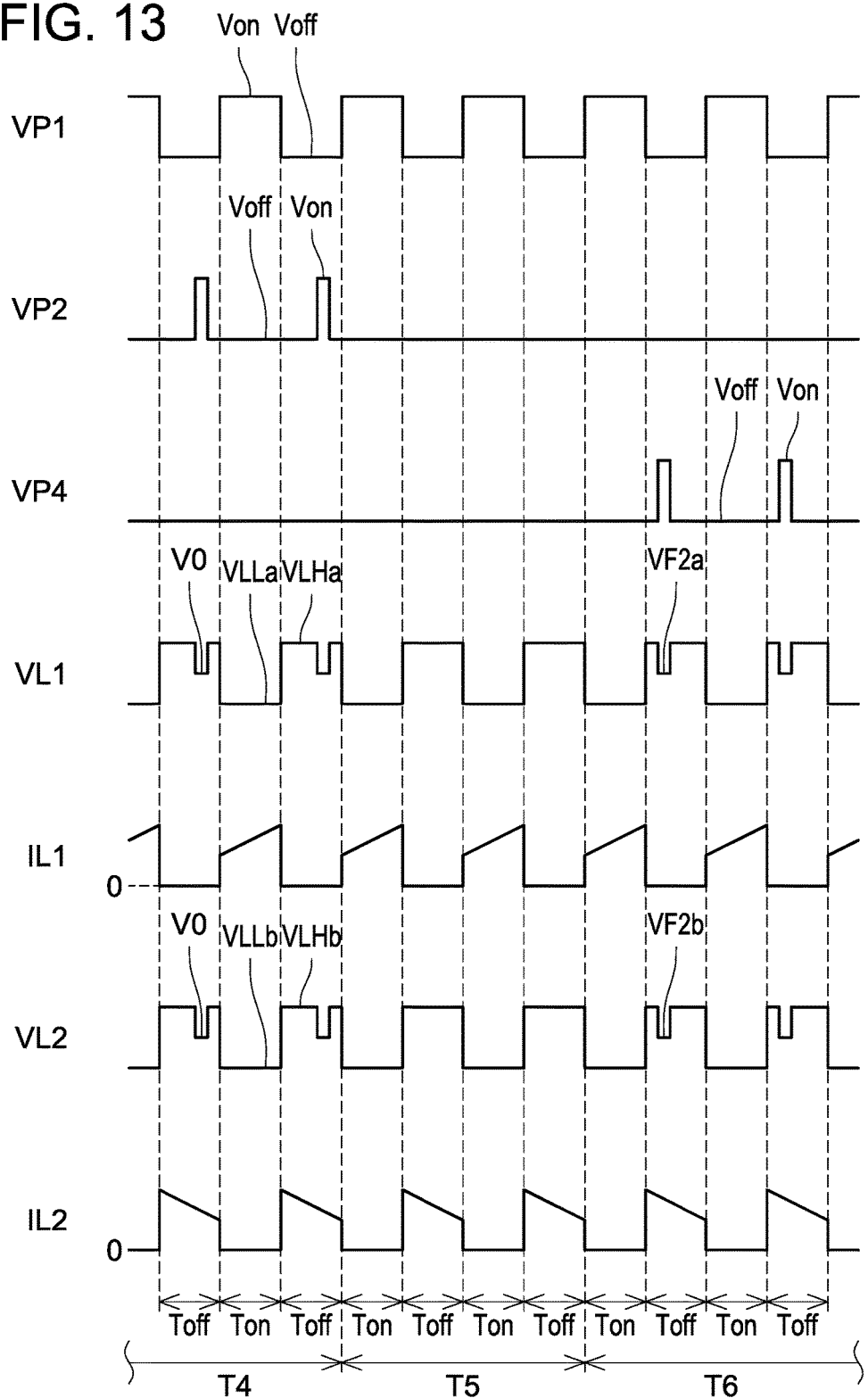
FIG. 13 is a graph showing an operation of a gate voltage control circuit of a sixth embodiment.

In the aforementioned fifth embodiment, the waveform of the voltage VL1 is same and the waveform of the voltage VL2 is same in both the case where the potential VH is greater than the reference value (period T4 in FIG. 12) and the case where the characteristic X is greater than the reference value (period T6 in FIG. 12). Due to this, when the potential VH is greater than the reference value and the characteristic X is greater than the reference value, signal transmission and receipt between circuits on the secondary coil 80b side and the primary circuit 50a become difficult. Due to this, as shown in FIG. 13, timings when the intermediate voltages are generated may be changed between the case where the potential VH is greater than the reference value (period T4) and the case where the characteristic X is greater than the reference value (period T6). That is, the waveforms of the voltages VL1, VL2 may be different between the period T4 and the period T6.

Seventh Embodiment

Figure 14:
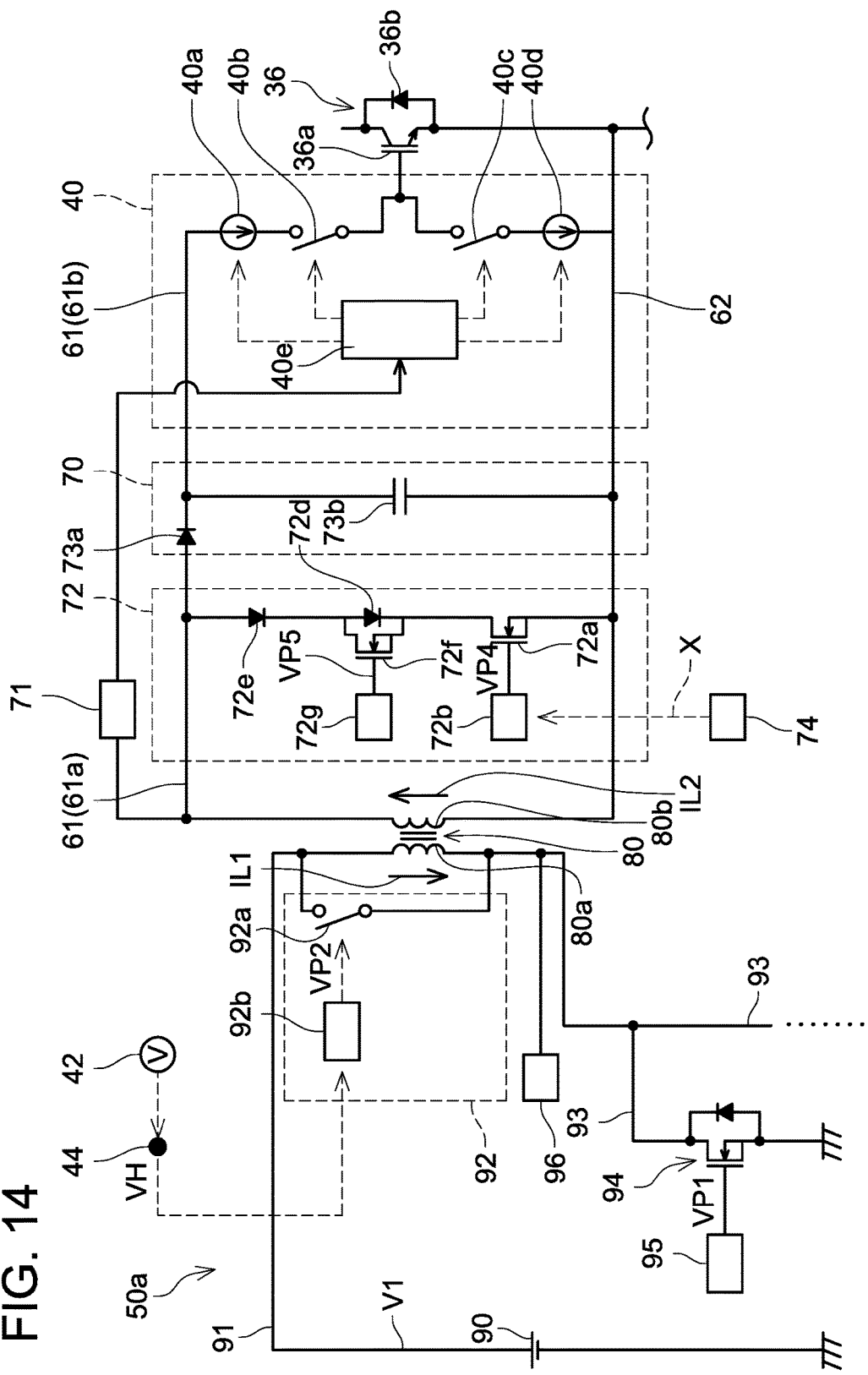
FIG. 14 is a detailed circuit diagram of a gate voltage control circuit of a seventh embodiment.

As shown in FIG. 14, in the seventh embodiment, the signal generating circuit 72 includes two diodes 72d, 72c connected in series to the NMOS 72a. That is, a serial circuit of the NMOS 72a, the diode 72d, and the diode 72e is connected in parallel to the secondary coil 80b. The diode 72d is connected so as to have its cathode oriented toward the wiring 62, and its anode oriented toward the wiring 61a. The diode 72e is connected so as to have its cathode oriented toward the wiring 62, and its anode oriented toward the wiring 61a. Notably, in FIG. 14, the diodes 72d, 72c are connected between the NMOS 72a and the wiring 61a, however, an order by which the NMOS 72a, the diode 72d, and the diode 72e are arranged may be of any order.

An NMOS 72f is connected between the anode and the cathode of the diode 72d. A signal transmission control device 72g is connected to a gate of the NMOS 72f. A value of the characteristic X is transmitted to the signal transmission control device 72g. The signal transmission control device 72g applies a signal VP5 to the gate of the NMOS 72f according to the value of the received characteristic X.

Figure 15:
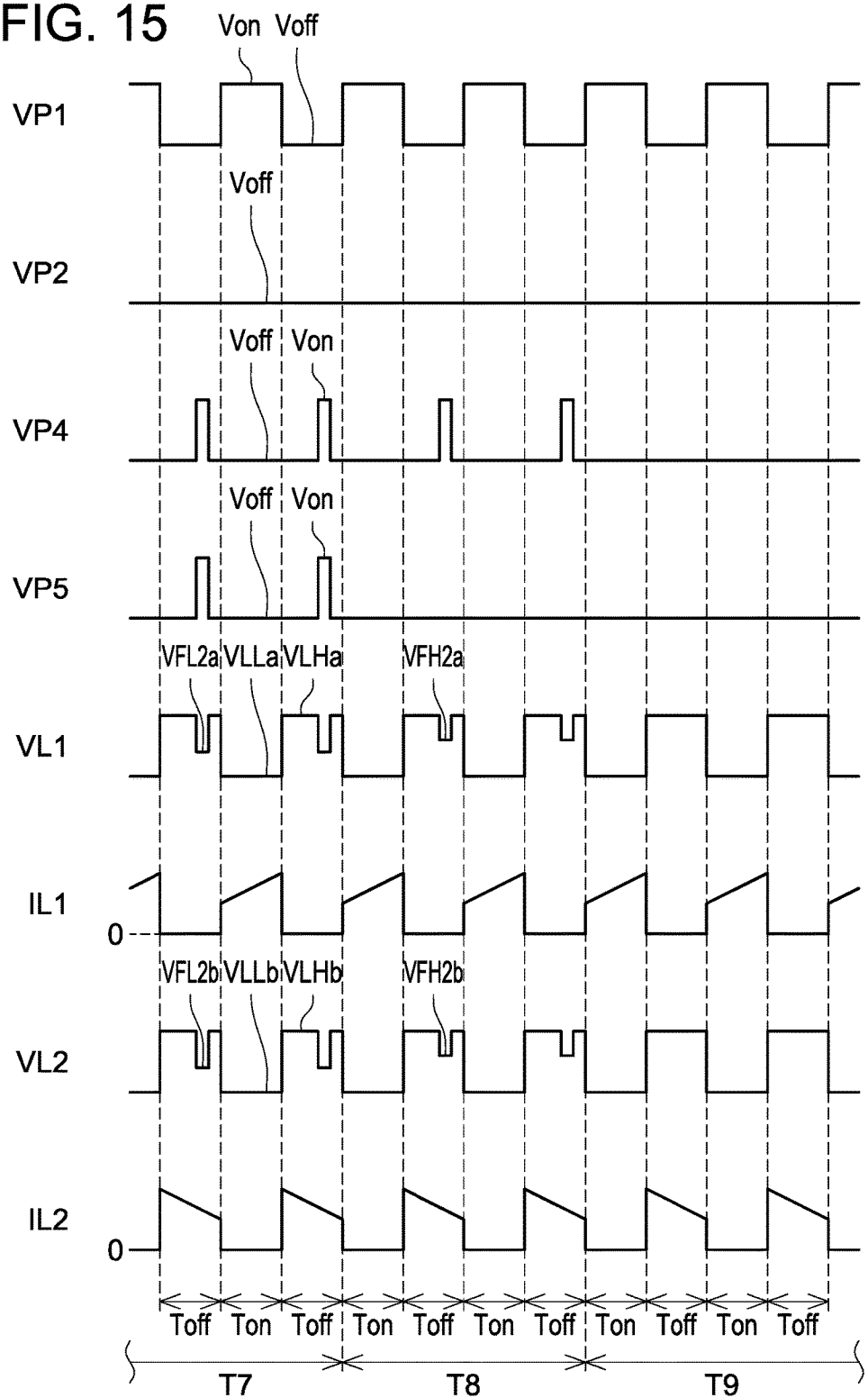
FIG. 15 is a graph showing an operation of the gate voltage control circuit of the seventh embodiment.

In the seventh embodiment, the operation for the case where the potential VH is higher than the reference value is same as that of the period T4 of FIG. 12. In the seventh embodiment, the operation for the case where the potential VH is equal to or less than the reference value is shown in FIG. 15. In FIG. 15, since the potential VH is equal to or less than the reference value, the signal VP2 is maintained to be of the low potential Voff and the switch 92a is kept off at all times. In the seventh embodiment, signals are transmitted from the circuits on the secondary coil 80b side to the primary circuit 50a depending on three cases, namely a case where the characteristic X is in a first range greater than the first reference value, a case where the characteristic X is in a second range equal to or less than the first reference value but greater than a second reference value, and a case where the characteristic X is in a third range equal to or less than the second reference value. A period T7 in FIG. 15 shows the operation for the case of the first range, a period T8 of FIG. 15 shows the operation for the case of the second range, and a period T9 of FIG. 15 shows the operation for the case of the third range.

When the characteristic X is in the first range (period T7), the signal transmission control device 72b controls the signal VP4 to be of the high potential Von during a partial period in the latter half of the off-period Toff. Further, in this case, the signal transmission control device 72g controls the signal VP5 to be of the high potential Von during the partial period in the latter half of the off-period Toff Thus, the NMOS 72a and the NMOS 72f are turned on during the partial period in the latter half of the off-period Toff. When the NMOS 72f turns on, the anode and the cathode of the diode 72d are short circuited. Further, when the NMOS 72a turns on, both ends of the primary coil 80a are connected by the NMOS 72a, the NMOS 72t and the diode 72e. Thus, the voltage VL2 between both ends of each secondary coil 80b becomes voltage VFL2b, which is substantially equal to the forward voltage drop of the diode 72e during the partial period in the latter half of the off-period Toff Due to this, at this timing, the voltage VL1 between both ends of each primary coil 80a becomes voltage VFL2a, which corresponds to the voltage VFL2b.

When the characteristic X is in the second range (period T8), the signal transmission control device 72b controls the signal VP4 to be of the high potential Von during a partial period in the latter half of the off-period Toff. Thus, the NMOS 72a is turned on during the partial period in the latter half of the off-period Toff. On the other hand, in this case, the signal transmission control device 72g maintains the signal VP5 to be of the low potential Voff over the entire off-period Toff. Thus, the NMOS 72f is maintained off over the entire off-period Toff. Accordingly, both ends of each secondary coil 80b are connected by the NMOS 72a, the diode 72*d*, and the diode 72*e* by the NMOS 72*a* turning on. Accordingly, the voltage VL2 between both ends of the secondary coil 80*b* becomes voltage VFH2*b* during the partial period in the latter half of the off-period Toff, which adds the forward voltage drop of the diode 72*d* and the forward voltage drop of the diode 72*e*. That is, the intermediate voltage VFH2*b* in the period T8 becomes larger than the intermediate voltage VFL2*b* in the period T7. Due to this, the voltage VL1 generated in each primary coil 80*a* also becomes intermediate voltage VFH2*a*, which is higher than the intermediate voltage VFL2*a*.

When the characteristic X is in the third range (period T9), the signal transmission control device 72*b* maintains the signal VP4 to be of the low potential Voff over the entire off-period Toff, and the signal transmission control device 72*g* maintains the signal VP5 to be of the low potential Voff over the entire off-period Toff Thus, in the period T9, the variable voltages VL1, VL2 do not have any intermediate voltage.

The waveform detection circuit 96 detects the variable voltage VL1 between both ends of the primary coil 80*a*, and determines whether the variable voltage VL1 has the intermediate voltage VFL2*a*, the intermediate voltage VFH2*a*, or no intermediate voltage. Due to this, the waveform detection circuit 96 determines which of the first, second, and third ranges the characteristic X is in.

As above, according to the configuration of the seventh embodiment, the magnitude of the intermediate voltage can be used as a signal. According to this configuration, information in greater detail can be transmitted to the primary circuit 50*a* from the circuits on the secondary coil 80*b* side.

Notably, the diode 72*e* may be omitted in the seventh embodiment.

Eighth Embodiment

Figure 16:
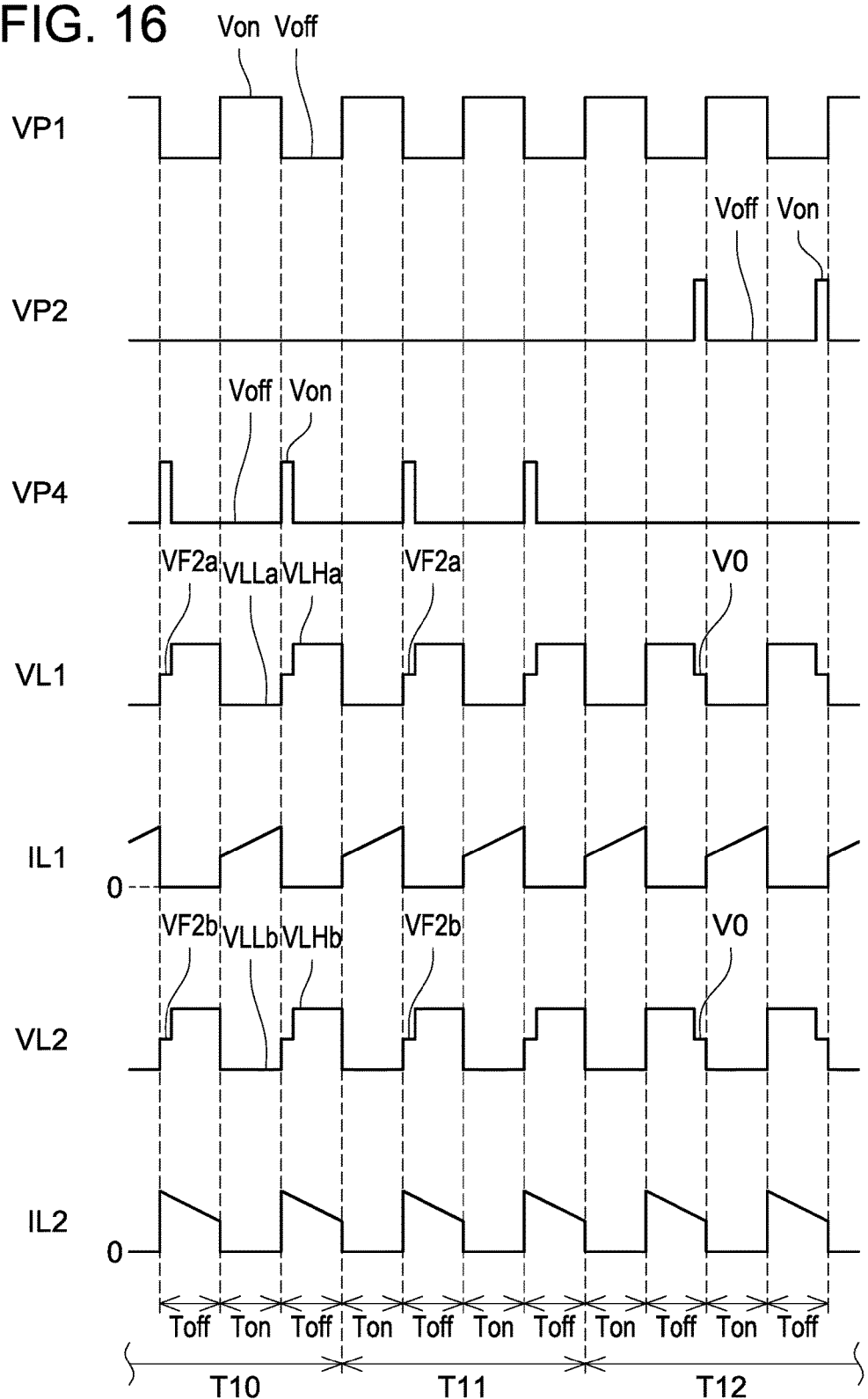
FIG. 16 is a graph showing an operation of a gate voltage control circuit of an eighth embodiment.

The configuration of the gate voltage control circuit of the eighth embodiment is similar to the configuration of the gate voltage control circuit of the fifth embodiment (FIG. 11). FIG. 16 shows the operation of the gate voltage control circuit of the eighth embodiment. A period T10 in FIG. 16 shows a case where the characteristic X is greater than its reference value, and the potential VH is equal to or less than the reference value. A period T11 in FIG. 16 shows a case where the characteristic X is greater than its reference value, and the potential VH is greater than the reference value. A period T12 in FIG. 16 shows a case where the characteristic X is less than its reference value, and the potential VH is greater than the reference value. In the period T10 of FIG. 16, the intermediate voltages for the voltages VL1, VL2 are provided at the beginning of the off-period Toff. The operation of the gate voltage control circuit in the period T10 is similar to the operation in the period T6 of FIG. 12, except for the positions of the intermediate voltages. Further in the period T12 of FIG. 16, the intermediate voltages for the voltages VL1, VL2 are provided at the end of the off-period Toff. The operation of the gate voltage control circuit in the period T12 is similar to the operation in the period T4 of FIG. 12, except for the positions of the intermediate voltages. As above, the intermediate voltages indicating that the characteristic X is larger than the reference value (intermediate voltages in period T10) is set on an earlier side than the intermediate voltages indicating that the potential VH is larger than the reference value (intermediate voltages in period T12) within the off-period Toff.

During the period T11, since the characteristic X is greater than the reference value, the signal transmission control device 72*b* turns the NMOS 72*a* on at the beginning of the off-period Toff Due to this, the intermediate voltages are generated in the voltages VL1, VL2 at the beginning of the off-period Toff. At this occasion, the waveform detection circuit 96 detects the intermediate voltages at the beginning of the off-period Toff. Due to this, the primary circuit 50*a* receives the signal indicating that the characteristic X is greater than the reference value. When the waveform detection circuit 96 detects the intermediate voltages at the beginning of the off-period Toff, a signal indicating as such is transmitted from the waveform detection circuit 96 to the signal transmission control device 92*b*. At this occasion, the signal transmission control device 92*b* maintains the signal VP2 to be of the low potential Voff during the rest of the off-period Toff even if the potential VH is higher than the reference value, so that the switch 92*a* is kept off. Due to this, the signal indicating that the potential VH is higher than the reference value is not transmitted. As above, the transmission of the signal indicating that the potential VH is higher than the reference value is omitted when the potential VH is greater than the reference value and the characteristic X is greater than the reference value. According to this configuration, the value obtained by integrating a one-cycle worth of variable voltage VL2 by time is equal among the periods T10, T11, T12. Due to this, a difference is less likely to occur in the energy supplied to the voltage regulator circuits 40 among the periods T10, T11, and T12. According to this configuration, the power can be supplied to the voltage regulator circuits 40 with greater stability.

Ninth Embodiment

In the aforementioned first to eighth embodiments, the information on the potential VH may be transmitted from the primary circuit 50*a* to the voltage regulator circuits 40 by waveforms that are worth multiple cycles of the variable voltages VL1, VL2. For example, the waveform of the variable voltage VL1(VL2) in the period T1 of FIG. 4 is used to indicate "0" and the waveform of the variable voltage VL1(VL2) in the period T2 of FIG. 4 is used to indicate "1", and a signal including a binary string of "1" and "0" may be sent using the variable voltage worth multiple cycles. According to this configuration, a serial communication can be performed between the primary circuit 50*a* and each voltage regulator circuit 40. Further, the serial communication may be used to transmit signals from the circuits on the secondary coil 80*b* side (signal generating circuit 72) to the primary circuit 50*a*.

For example, the signal transmission control device 92*b* may apply a serial signal indicating the value of the potential VH itself to the primary coil 80*a*, and the detection circuit 71 may receive the serial signal. Further, the detection circuit 71 may determine whether or not the potential VH is greater than the reference value, and transmit the determination result to the corresponding voltage regulator circuit 40.

Notably, in the aforementioned first to ninth embodiments, the value of the potential VH is sent from the primary circuit 50*a* to the voltage regulator circuits 40, however, other physical quantity (such as current in a specific wiring, a temperature of a specific element, and an instruction signal from outside) may be transmitted. Further, in the aforementioned first to ninth embodiments, the value of the characteristic X (value indicating whether or not an error is occurring) is transmitted from the circuits on the secondary coil 80*b* side, however, other values (such as a temperature of the IGBT 36*a*) may be transmitted.

Further, in the aforementioned first to ninth embodiments, the switching speed of each IGBT 36b is changed according to the value of the potential VH. However, other characteristics of the change pattern of the gate voltage (such as a magnitude of an on-voltage or an off-voltage, and a duty ratio of an on-voltage application period and an off-voltage application period) may be changed.

Relationships with the respective constituent features of the aforementioned embodiments and the respective constituent features of the claims will be described. The detection circuit 42 of the embodiments is an example of a detection circuit of the claims. The NMOS 94 of the embodiments is an example of a power supply switching element of the claims. The switch 92a of the embodiments is an example of a first signal transmission switching element of the claims. The rising waveform of the voltage VL1 in the period T1 of FIG. 8 of the embodiments is an example of a rising waveform that starts from the negative voltage period through the intermediate voltage period to reach the positive voltage period of the claims. The rising waveform of the voltage VL1 in the period T2 of FIG. 8 of the embodiments is an example of a rising waveform that starts from the negative voltage period to reach the positive voltage period without intervening the intermediate voltage period between the negative and positive voltage periods of the claims. The configuration of FIG. 10 of the embodiments is an example of a configuration in which a magnitude of the intermediate voltage changes in accordance with the signal transmitted from the detection circuit of the claims. The diode 92c of the embodiments is an example of a diode, a cathode of the diode being connected to the first signal transmission switching element in series in a direction along which the cathode is oriented toward the positive electrode of the direct power source of the claims. The NMOS 72a of the embodiments is an example of a second signal transmission switching element of the claims. The waveform detection circuit 96 of the embodiments is an example of a waveform detection circuit of the claims. The period during which the voltage V0 is applied in FIGS. 13 and 16 of the embodiments is an example of a first period of the claims. The period during which the voltage VF2b is applied in FIGS. 13 and 16 of the embodiments is an example of a second period of the claims.

Technical elements disclosed herein will be listed hereinbelow. Notably, each of the technical elements disclosed hereinbelow is independently useful.

In a configuration example of the present disclosure, the primary circuit comprises a direct power source, a power supply switching element, a first signal transmission switching element, a power supply control device, and a first signal transmission control device. A positive electrode of the direct power source is connected to one ends of the primary coils. The power supply switching element is connected between the other ends of the primary coils and a negative electrode of the direct power source. The first signal transmission switching element is connected in parallel to the primary coils. The power supply control device is configured to cyclically switch the power supply switching element. The first signal transmission control device is configured to synchronize with a switching cycle of the power supply switching element to switch the first signal transmission switching element and change a switching pattern of the first signal transmission switching element in accordance with the signal transmitted from the detection circuit.

According to this configuration, the variable voltages can be generated in each of the primary coils and each of the secondary coils by switching of the power supply switching element. Further, by changing the switching pattern of the first signal transmission switching element according to the signals (that is, physical quantity), the waveforms of the variable voltages generated in each of the primary coils and each of the secondary coils can be changed.

In a configuration example of the present disclosure, one of the plurality of waveform types comprises a positive voltage period during which the voltage is maintained to a positive voltage, a negative voltage period during which the voltage is maintained to a negative voltage, and an intermediate voltage period during which the voltage is maintained to an intermediate voltage that is lower than the positive voltage and higher than the negative voltage.

The positive voltage can be generated by an inductive electromotive force of the isolation transformers. The negative voltage can be generated by the direct power source connected to the isolation transformers. Further, the intermediate voltage between the positive voltage and the negative voltage can easily be generated. Thus, according to this configuration, the variable voltage can easily be generated.

In the aforementioned configuration of generating intermediate voltage, the plurality of waveform types may comprise a first waveform and a second waveform, a length of the positive voltage period, a length of the negative voltage period, and a length of the intermediate voltage period may be equal between the first waveform and the second waveform, and a timing of the intermediate voltage period may be different between the first waveform and the second waveform.

According to this configuration, due to the length of each period is the same between the first waveform and the second waveform, a difference is less likely to occur between the first waveform and the second waveform in regards to energy sent from the primary circuit to the secondary circuit. Thus, according to this configuration, the power can more stably be supplied to the respective voltage regulator circuits.

In the aforementioned configuration of generating intermediate voltage, one of the plurality of waveform types may comprise a rising waveform that starts from the negative voltage period through the intermediate voltage period to reach the positive voltage period, and another one of the plurality of waveform types may comprise a rising waveform that starts from the negative voltage period to reach the positive voltage period without intervening the intermediate voltage period between the negative and positive voltage periods.

Depending on the operation state of the gate voltage control device, the current flowing in each secondary coil may in some cases drop to substantially zero. When this happens, ringing is generated in each secondary coil, and the voltage generated in each secondary coil oscillates. During when the ringing is generated, it is difficult to detect a voltage corresponding to the intermediate voltage on the secondary coil side even if the intermediate voltage is applied to the primary coil. In the above configuration, the intermediate voltage is applied in the rising of the waveform. Since no ringing will be generated in the rising of the waveform, the voltage corresponding to the intermediate voltage can surely be detected on the secondary coil side.

In the aforementioned configuration of generating intermediate voltage, a magnitude of the intermediate voltage may change in accordance with the signal transmitted from the detection circuit.

According to this configuration, information can be transmitted according to the magnitude of the intermediate voltage.

In a configuration example of the present disclosure, the gate voltage control device further comprises a diode, a cathode of the diode being connected to the first signal transmission switching element in series in a direction along which the cathode is oriented toward the positive electrode of the direct power source.

There is a case where both of the first signal transmission switching element and the power supply switching element come to be in the on-state due to noise influence and the like. According to the above configuration, the positive and negative electrodes of the DC power source can be prevented from becoming short circuited by the diode even if both of the first signal transmission switching element and the power supply switching element come to be in the on-state. Due to this, a large load can be prevented from being applied to the DC power source.

In a configuration example of the present disclosure, the gate voltage control device further comprises a signal generation circuit connected to at least one of the secondary coils. The signal generating circuit comprises: a second signal transmission switching element connected between both ends of the at least one secondary coil; and a second signal transmission control device configured to control the second signal transmission switching element. The primary circuit comprises a waveform detection circuit configured to detect a waveform of the variable voltage generated in the corresponding primary coil.

In this configuration, by switching the switching element for the second signal, the waveforms of the variable voltages generated in the primary coil and the secondary coil can be controlled. The second signal transmission switching element is switched to perform detection in the primary circuit for the waveform of the voltage generated in the primary circuit, and signals can be transmitted from the circuit(s) on the secondary coil side to the primary circuit.

In the aforementioned configuration of transmitting a signal from the circuit(s) on the secondary coil side to the primary circuit, in a case the signal transmitted from the detection circuit is a specific signal, the first signal transmission control device may turn on the first signal transmission switching element during a first period that is a part of an off-period during which the power supply control device keeps the power supply switching element off. In a specific case, the second signal transmission control device may turn on the second signal transmission switching element during a second period that is a part of the off-period. The first period and the second period may not overlap.

According to this configuration, the periods are offset between the case of turning the first signal transmission switching element on (that is, the case of transmitting a signal from the primary circuit to the secondary circuits) and the case of turning the second signal transmission switching element on (that is, the case of transmitting a signal from the secondary circuits to the primary circuit). Due to this, these signals can surely be distinguished.

In the aforementioned configuration in which the first period and the second period do not overlap, the second period may be set earlier than the first period. When the waveform detection circuit detects a voltage corresponding to an on-voltage of the second signal transmission switching element during the second period, the first signal transmission control device may not turn on the first signal transmission switching element during the first period even if the signal transmitted from the detection circuit is the specific signal.

According to this configuration, when the first signal transmission switching element turns on, the voltages generated in the primary and secondary coils become small during this period, and when the second signal transmission switching element turns on, the voltages generated in the primary and secondary coils become small during this period. If both of the period during which the first signal transmission switching element turns on and the period during which the second signal transmission switching element turns on exist in one waveform, the energy supplied by this waveform becomes extremely small. According to the above configuration, the period during which the first signal transmission switching element turns on and the period during which the second signal transmission switching element turns on would not exist within the same waveform, a stable power supply can be enabled.

In a configuration example of the present disclosure, each voltage regulator circuit changes the change-pattern of the corresponding gate voltage in accordance with a combination of waveform types in multiple cycles of the variable voltage generated in the corresponding secondary coil.

According to this configuration, more complicated information can be transmitted from the primary circuit to the respective voltage regulator circuits.

In a configuration example of the present disclosure, each voltage regulator circuit changes a switching speed of the corresponding switching element in accordance with a waveform type of the variable voltage generated in the corresponding secondary coil.

According to this configuration, a surge generated in the switching elements is suppressed while suppressing loss generated in the switching elements.

While specific examples of the present invention have been described above in detail, these examples are merely illustrative and place no limitation on the scope of the patent claims. The technology described in the patent claims also encompasses various changes and modifications to the specific examples described above. The technical elements explained in the present description or drawings provide technical utility either independently or through various combinations. The present invention is not limited to the combinations described at the time the claims are filed. Further, the purpose of the examples illustrated by the present description or drawings is to satisfy multiple objectives simultaneously, and satisfying any one of those objectives gives technical utility to the present invention.

What is claimed is:

1. A gate voltage control device configured to control a gate voltage applied to each of gates of a plurality of switching elements connected to a main current circuit, the gate voltage control device comprising:
   a detection circuit;
   a plurality of isolation transformers, each isolation transformer including a primary coil and a secondary coil;
   a primary circuit connected to the primary coils;
   a plurality of secondary circuits; and
   a plurality of voltage regulator circuits,
   wherein
   each of the plurality of secondary circuits is connected to a corresponding one of the secondary coils,
   each of the plurality of voltage regulator circuits is connected to a corresponding one of the secondary circuits and a corresponding one of the gates,
   the detection circuit detects a physical quantity, and transmits a signal corresponding to the detected physical quantity to the primary circuit,
   the primary circuit is configured to allow a variable voltage to be applied in a plurality of waveform types between both ends of each primary coil, and the primary circuit cyclically performs applying the variable voltage in a waveform type that corresponds to the signal transmitted from the detection circuit to between both ends of each primary coil, each secondary circuit converts the variable voltage generated in the corresponding secondary coil to a direct voltage, and each voltage regulator circuit is powered by the direct voltage converted by the corresponding secondary circuit as a power source, changes the corresponding gate voltage cyclically, and changes a change-pattern of the corresponding gate voltage in accordance with a waveform type of the variable voltage generated in the corresponding secondary coil.

2. The gate voltage control device according to claim 1, wherein the primary circuit comprises:
- a direct power source, of which positive electrode is connected to one ends of the primary coils,
- a power supply switching element connected between the other ends of the primary coils and a negative electrode of the direct power source,
- a first signal transmission switching element connected in parallel to the primary coils,
- a power supply control device configured to cyclically switch the power supply switching element, and
- a first signal transmission control device configured to synchronize with a switching cycle of the power supply switching element to switch the first signal transmission switching element and change a switching pattern of the first signal transmission switching element in accordance with the signal transmitted from the detection circuit.

3. The gate voltage control device according to claim 1, wherein one of the plurality of waveform types comprises a positive voltage period during which the voltage is maintained to a positive voltage, a negative voltage period during which the voltage is maintained to a negative voltage, and an intermediate voltage period during which the voltage is maintained to an intermediate voltage that is lower than the positive voltage and higher than the negative voltage.

4. The gate voltage control device according to claim 3, wherein the plurality of waveform types comprises a first waveform and a second waveform, a length of the positive voltage period, a length of the negative voltage period, and a length of the intermediate voltage period are equal between the first waveform and the second waveform, and a timing of the intermediate voltage period is different between the first waveform and the second waveform.

5. The gate voltage control device according to claim 3, wherein one of the plurality of waveform types comprises a rising waveform that starts from the negative voltage period through the intermediate voltage period to reach the positive voltage period, and another one of the plurality of waveform types comprises a rising waveform that starts from the negative voltage period to reach the positive voltage period without intervening the intermediate voltage period between the negative and positive voltage periods.

6. The gate voltage control device according to claim 3, wherein a magnitude of the intermediate voltage changes in accordance with the signal transmitted from the detection circuit.

7. The gate voltage control device according to claim 2, further comprising a diode, a cathode of the diode being connected to the first signal transmission switching element in series in a direction along which the cathode is oriented toward the positive electrode of the direct power source.

8. The gate voltage control device according to claim 2, further comprising a signal generation circuit connected to at least one of the secondary coils, wherein the signal generating circuit comprises:
- a second signal transmission switching element connected between both ends of the at least one secondary coil; and
- a second signal transmission control device configured to control the second signal transmission switching element, and the primary circuit comprises a waveform detection circuit configured to detect a waveform of the variable voltage generated in the corresponding primary coil.

9. The gate voltage control device according to claim 8, wherein in a case the signal transmitted from the detection circuit is a specific signal, the first signal transmission control device turns on the first signal transmission switching element during a first period that is a part of an off-period during which the power supply control device keeps the power supply switching element off, and in a specific case, the second signal transmission control device turns on the second signal transmission switching element during a second period that is a part of the off-period, wherein the first period and the second period do not overlap.

10. The gate voltage control device according to claim 9, wherein the second period is set earlier than the first period, when the waveform detection circuit detects a voltage corresponding to an on-voltage of the second signal transmission switching element during the second period, the first signal transmission control device does not turn on the first signal transmission switching element during the first period even if the signal transmitted from the detection circuit is the specific signal.

11. The gate voltage control device according to claim 1, wherein each voltage regulator circuit changes the change-pattern of the corresponding gate voltage in accordance with a combination of waveform types in multiple cycles of the variable voltage generated in the corresponding secondary coil.

12. The gate voltage control device according to claim 1, wherein each voltage regulator circuit changes a switching speed of the corresponding switching element in accordance with a waveform type of the variable voltage generated in the corresponding secondary coil.

* * * * *